US012646693B2

(12) United States Patent
Nagaseki et al.

(10) Patent No.: US 12,646,693 B2
(45) Date of Patent: *Jun. 2, 2026

(54) PROCESSING METHOD AND PLASMA PROCESSING APPARATUS

(71) Applicant: Tokyo Electron Limited, Tokyo (JP)

(72) Inventors: Kazuya Nagaseki, Miyagi (JP); Kazuki Moyama, Miyagi (JP); Shinji Himori, Miyagi (JP); Masanobu Honda, Miyagi (JP); Satoru Teruuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/421,988

(22) Filed: Jan. 25, 2024

(65) Prior Publication Data

US 2024/0213000 A1    Jun. 27, 2024

Related U.S. Application Data

(63) Continuation of application No. PCT/JP2022/029017, filed on Jul. 27, 2022.

(30) Foreign Application Priority Data

Aug. 3, 2021    (JP) ................................. 2021-127644

(51) Int. Cl.
*H01J 37/32* (2006.01)
*H10P 72/72* (2026.01)

(52) U.S. Cl.
CPC .... *H01J 37/32724* (2013.01); *H01J 37/3244* (2013.01); *H10P 72/722* (2026.01); *H01J 2237/2065* (2013.01)

(58) Field of Classification Search
CPC .......... H01J 37/3244; H01J 2237/2065; H01L 21/6833
See application file for complete search history.

(56) References Cited

U.S. PATENT DOCUMENTS

| 2012/0273135 A1 | 11/2012 | Hida et al. |
| 2015/0114567 A1 | 4/2015 | Nagayama et al. |
| 2024/0213000 A1* | 6/2024 | Nagaseki ............. H01L 21/683 |

FOREIGN PATENT DOCUMENTS

| JP | H02-34595 A | 2/1990 |
| JP | H05-109847 A | 4/1993 |

(Continued)

OTHER PUBLICATIONS

International Search Report and Written Opinion mailed on Sep. 20, 2022, received for PCT Application PCT/JP2022/029017, filed on Jul. 27, 2022, 11 pages including English Translation.

*Primary Examiner* — Monica C King
(74) *Attorney, Agent, or Firm* — XSENSUS LLP

(57) ABSTRACT

A processing method for performing plasma processing on a substrate includes placing a temperature adjustment target onto a support surface of a substrate support in a decompressible processing, forming a heat transfer layer by supplying, through the substrate support, a heat transfer medium including at least one of a liquid medium or a solid medium with fluidity to between the support surface of the substrate support and a back surface of the temperature adjustment target, performing plasma processing on the substrate on the support surface on which the heat transfer layer is formed, and separating the temperature adjustment target from the support surface after the plasma processing.

28 Claims, 16 Drawing Sheets

(56) References Cited

FOREIGN PATENT DOCUMENTS

| JP | 2004-140056 A | 5/2004 |
| JP | 2004-311592 A | 11/2004 |

* cited by examiner

PROCESSING METHOD AND PLASMA PROCESSING APPARATUS

CROSS-REFERENCE TO RELATED APPLICATIONS

This application is a continuation of international application no. PCT/JP2022/029017, filed Jul. 27, 2022, which claims priority to Japanese application no. JP2021-127644, filed Aug. 3, 2021. The entire contents of both prior applications are hereby incorporated herein by reference.

FIELD

The present disclosure relates to a processing method and a plasma processing apparatus.

BACKGROUND

Patent Literature 1 describes a substrate processing apparatus including a substrate support having a support surface on which a substrate is placeable and including a gas supply line for supplying a heat transfer gas to a clearance between the substrate and the support surface.

CITATION LIST

Patent Literature

Patent Literature 1: Japanese Unexamined Patent Application Publication No. 2020-120081

BRIEF SUMMARY

Technical Problem

The technique according to the present disclosure efficiently adjusts the temperature of a temperature adjustment target during plasma processing.

Solution to Problem

A processing method for performing plasma processing on a substrate according to an aspect of the present disclosure includes placing a temperature adjustment target onto a support surface of a substrate support in a processing chamber being decompressible, forming a heat transfer layer by supplying, through the substrate support, a heat transfer medium including at least one of a liquid medium or a solid medium with fluidity to between the support surface of the substrate support and a back surface of the temperature adjustment target, performing plasma processing on the substrate on the support surface on which the heat transfer layer is formed, and separating the temperature adjustment target from the support surface after the plasma processing.

Exemplary Advantageous Effects

The technique according to the above aspect of the present disclosure can efficiently adjust the temperature of a temperature adjustment target during plasma processing.

DETAILED DESCRIPTION

Figure 1:
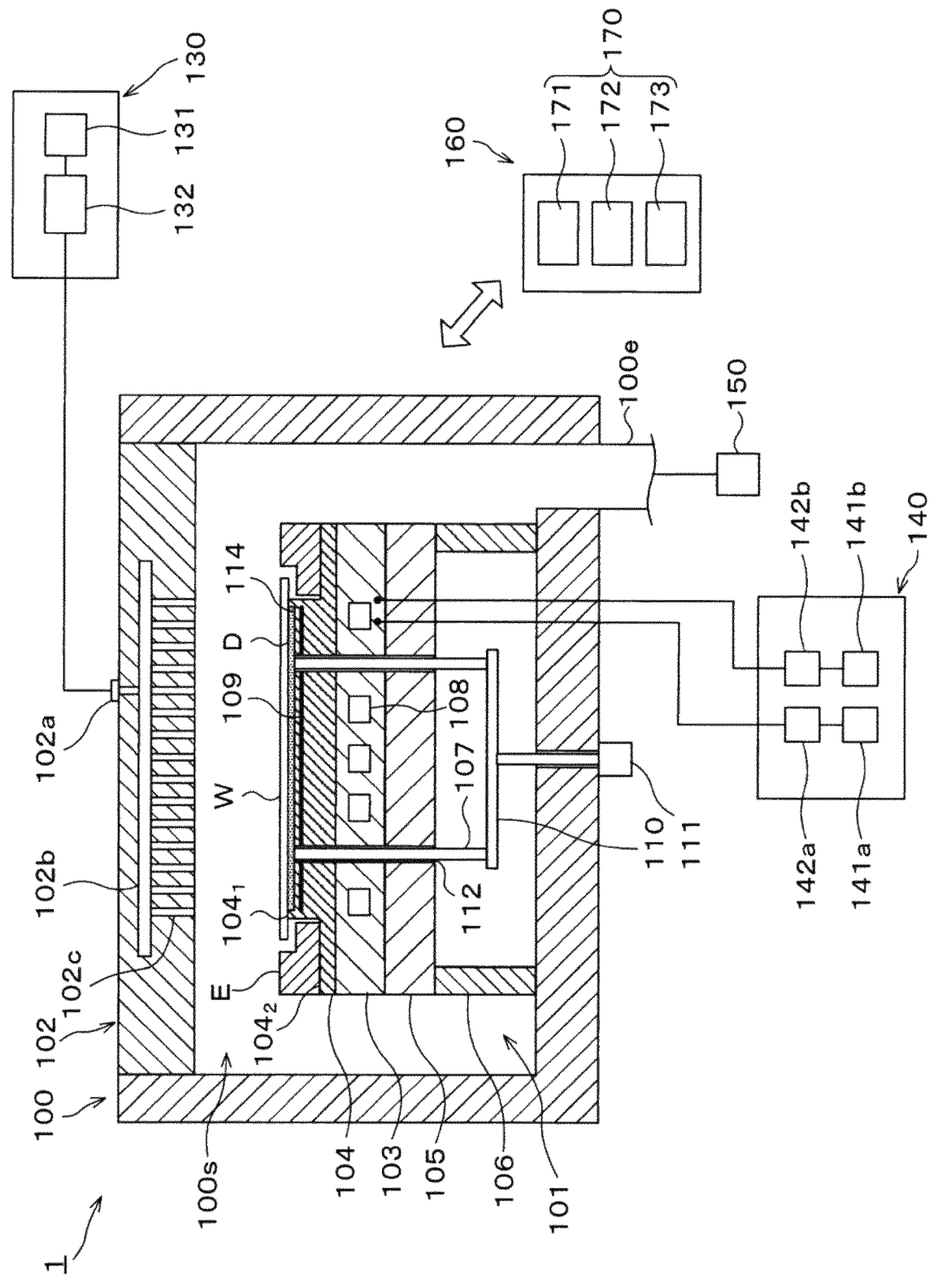
FIG. 1 is a schematic longitudinal cross-sectional view of a processing module as a plasma processing apparatus according to a first exemplary embodiment.

In the manufacturing process for semiconductor devices, or other devices, plasma processing such as etching or film deposition is performed on substrates including semiconductor wafers (hereafter referred to as wafers) using plasma. Plasma processing is performed on a substrate placed on a substrate support in a decompressed processing chamber.

To achieve intended and uniform plasma processing between the center and the periphery of the substrate, an annular member as viewed in plan or an edge ring may be placed on the substrate support to surround the substrate on the substrate support.

The results of plasma processing depend on the temperature of the substrate. The temperature of the substrate support is adjusted during plasma processing, thus allowing the temperature of the substrate to be adjusted through the substrate support. When the edge ring described above is used, the temperature of the edge ring also affects the results of plasma processing at the periphery of the substrate. The temperature of the edge ring is thus also to be adjusted. The temperature of the edge ring is also adjusted through the substrate support. To efficiently adjust the temperature of the substrate and the edge ring through the substrate support, a heat transfer gas, such as a He gas, is supplied to between the substrate support and the substrate and between the substrate support and the edge ring in a known structure.

However, when a large amount of heat is input from the plasma during plasma processing, the temperature of at least either the substrate or the edge ring may not be fully adjusted using a heat transfer gas as described above.

The technique according to one or more aspects of the present disclosure efficiently adjusts the temperature of at least either the substrate or the edge ring as a temperature adjustment target during plasma processing.

The processing method and the plasma processing apparatus according to the present exemplary embodiments will now be described with reference to the drawings. The same reference numerals denote components having substantially the same functions herein and in the drawings, and such components will not be described repeatedly.

First Exemplary Embodiment

Processing Module

Figure 2:
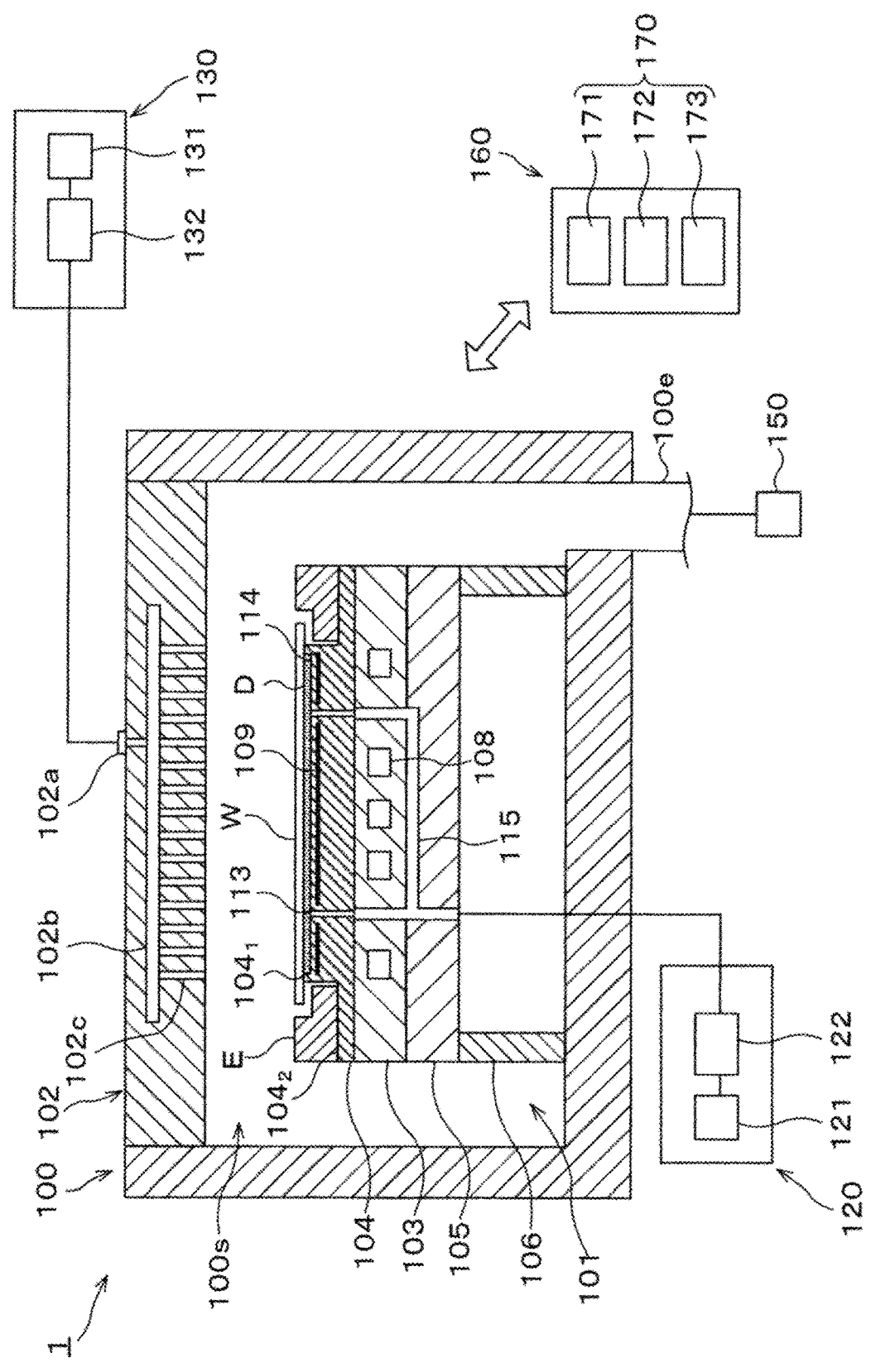
FIG. 2 is a schematic longitudinal cross-sectional view of the processing module as the plasma processing apparatus according to the first exemplary embodiment.

FIGS. 1 and 2 are each a schematic longitudinal cross-sectional view of a processing module as a plasma processing apparatus according to a first exemplary embodiment. FIGS. 1 and 2 show a wafer support (described later) in a cross section focusing on the components different from each other.

The processing module 1 in FIGS. 1 and 2 performs plasma processing such as etching or film deposition on a wafer W as a substrate. The processing module 1 includes a plasma processing chamber 100 as a processing chamber, gas supply units 120 and 130, a radio-frequency (RF) power supply unit 140, and an exhaust system 150. The processing module 1 further includes a wafer support 101 as a substrate support and an upper electrode 102.

The wafer support 101 is located in a lower area in a plasma processing space 100s in the plasma processing chamber 100, which is decompressible. The upper electrode 102 is located above the wafer support 101. The upper electrode 102 may serve as a part of a ceiling of the plasma processing chamber 100.

The wafer support 101 can support a wafer W in the plasma processing space 100s. In one exemplary embodiment, the wafer support 101 includes a lower electrode 103, an electrostatic chuck (ESC) 104, an insulator 105, legs 106, and lifters 107. The wafer support 101 further includes a temperature adjuster to adjust the temperature (e.g., the temperature of an upper surface 104$_1$ in a center portion) of the ESC 104. The temperature adjuster includes, for example, a heater, a channel, or a combination of these. The channel allows a temperature adjusting fluid such as a refrigerant or a heat transfer gas to flow.

The lower electrode 103 is formed from, for example, a conductive material such as aluminum and is fixed to the insulator 105. In one exemplary embodiment, a channel 108 for the temperature adjusting fluid is located inside the lower electrode 103. The channel 108 is a part of the temperature adjuster. The channel 108 receives a temperature adjusting fluid from, for example, a chiller unit (not shown) located outside the plasma processing chamber 100. The temperature adjusting fluid supplied to the channel 108 returns to the chiller unit. For example, the ESC 104, a wafer W placed on the ESC 104, and an edge ring E can be cooled to a predetermined temperature with low-temperature brine as a temperature adjusting fluid circulating through the channel 108. For example, the ESC 104, the wafer W placed on the ESC 104, and the edge ring E can also be heated to a predetermined temperature with high-temperature brine as a temperature adjusting fluid circulating in the channel 108.

The ESC 104 placed on the lower electrode 103 can electrostatically clamp the wafer W with an electrostatic force. In one exemplary embodiment, the ESC 104 has a central upper surface higher than a peripheral upper surface. The ESC 104 has the central upper surface 104$_1$ serving as a wafer support surface on which the wafer W is placeable and a peripheral upper surface 104$_2$ serving as a ring support surface on which the edge ring E is placeable. The edge ring E is an annular member as viewed in plan and is located adjacent to the wafer W to surround the wafer W placed on the central upper surface 104$_1$ of the ESC 104.

The ESC 104 is an example fastener that fastens the wafer W to the central upper surface 104$_1$ of the ESC 104, or more specifically, to the wafer support surface. An electrode 109 is located in a center portion of the ESC 104.

The electrode 109 receives a direct current (DC) voltage from a DC power supply (not shown). This generates an electrostatic force for electrostatically clamping the wafer W onto the central upper surface 104$_1$ of the ESC 104.

In one exemplary embodiment, the ESC 104 can also electrostatically clamp the edge ring E with an electrostatic force. The ESC 104 includes an electrode (not shown) to electrostatically clamp the edge ring E onto the wafer support 101.

In one exemplary embodiment, the peripheral upper surface 104$_2$ of the ESC 104 has a gas supply hole (not shown) for supplying a heat transfer gas such as a He gas to the back surface of the edge ring E on the peripheral upper surface 104$_2$. The heat transfer gas from a gas supply unit (not shown) is supplied through the gas supply hole. The gas supply unit may include one or more gas sources and one or more pressure controllers. In one exemplary embodiment, the gas supply unit supplies, for example, the heat transfer gas from the gas source(s) to the gas supply hole with the pressure controller(s).

The center portion of the ESC 104 has, for example, a smaller diameter than the wafer W. The wafer W placed on the central upper surface (hereafter referred to as a wafer support surface) 104$_1$ of the ESC 104 thus has its periphery protruding from the center portion of the ESC 104.

The edge ring E has, for example, a step in its upper portion. The edge ring E thus has an upper surface of its outer periphery higher than the upper surface of its inner periphery. The inner periphery of the edge ring E is located under the periphery of the wafer W protruding from the center portion of the ESC 104.

A heater (or more specifically, a heating resistor) included in the temperature adjuster may be located inside the ESC 104. The ESC 104 and the wafer W placed on the ESC 104 can be heated to a predetermined temperature with the heater energized. In this case, the ESC 104 includes, for example, the electrode 109 for electrostatically clamping the wafer and the electrode for electrostatically clamping the edge ring between insulators and includes the heater buried inside the ESC 104.

The center portion of the ESC 104 including the electrode 109 for electrostatically clamping the wafer and the periphery of the ESC 104 including the electrode for electrostatically clamping the edge ring may be integral or separate from each other.

The insulator 105 is a disk of a ceramic material or another material, and the lower electrode 103 is fixed to the insulator 105. The insulator 105 has, for example, the same diameter as the lower electrode 103.

The legs 106 are cylinders of a ceramic material or another material supporting the ESC 104 with the lower electrode 103 and the insulator 105 in between. The legs 106 have, for example, an outer diameter equivalent to the outer diameter of the insulator 105 to support the periphery of the insulator 105.

Each lifter 107 is, for example, a cylindrical lifter that ascends and descends relative to the wafer support surface 104₁ of the ESC 104. When the lifter 107 ascends, its upper end protrudes from the wafer support surface 104₁ to support the wafer W. The lifters 107 allow transfer of the wafer W between the ESC 104 and an external transferrer (not shown). Three or more lifters 107 spaced from one another extend in the vertical direction.

Each lifter 107 is connected to a support 110 supporting the lifter 107. The support 110 is connected to a drive 111 that generates a driving force to raise and lower the support 110 to raise and lower the multiple lifters 107. The drive 111 includes, for example, a motor (not shown) as a drive source to generate the driving force described above.

Each lifter 107 is placed through a through-hole 112 having the upper end that is open in the wafer support surface 104₁ of the ESC 104. The through-hole 112 extends through, for example, the center portion of the ESC 104, the lower electrode 103, and the insulator 105. The lifters 107, the support 110, and the drive 111 are included in a lift assembly that raises and lowers the wafer W relative to the wafer support surface 104₁.

In the present exemplary embodiment, a heat transfer medium including at least one of a liquid medium or a solid medium with fluidity is supplied to the wafer support surface 104₁ through the wafer support 101 to form a heat transfer layer D from the above heat transfer medium as described later.

As shown in FIG. 2, supply ports 113 for the heat transfer medium are located in the wafer support surface 104₁ of the ESC 104 in the wafer support 101. For example, multiple supply ports 113 are located in the wafer support surface 104₁. The wafer support surface 104₁ may have grooves 114. The grooves 114 allow the heat transfer medium to flow and spread along the wafer support surface 104₁.

A channel 115 is located in the wafer support 101. The channel 115 has its ends connected to the respective supply ports 113 to allow fluid passage. The channel 115 has another end, opposite to these ends, that is fluidly connected to, for example, a gas supply unit 120. The channel 115 has, for example, thinner ends adjacent to the wafer support surface 104₁ (more specifically, for example, a portion inside the ESC 104). The heat transfer medium in the channel 115 is supplied to the wafer support surface 104₁ by capillary action through the supply ports 113. The channel 115 extends through, for example, the ESC 104, the lower electrode 103, and the insulator 105.

The gas supply unit 120 may include one or more gas sources 121 and one or more flow controllers 122. In one exemplary embodiment, the gas supply unit 120 supplies, for example, one or more gases for generating the heat transfer medium described above (hereafter referred to as heat transfer medium generation gases) from the respective gas sources 121 to the wafer support 101 through the corresponding flow controllers 122. Each flow controller 122 may include, for example, a mass flow controller or a pressure-based flow controller. The gas supply unit 120 may further include one or more flow rate modulators that supply one or more heat transfer medium generating gases at a modulated flow rate or in a pulsed manner.

The heat transfer medium generation gas supplied from the gas supply unit 120 is cooled in the channel 115 by, for example, the lower electrode 103 cooled by a temperature adjusting fluid in the channel 108, liquefies or solidifies, and then turns into a heat transfer medium including at least one of a liquid medium or a solid medium with fluidity. The liquid herein includes a sol or a gel with a liquid as a dispersant. As described above, the heat transfer medium is supplied to the wafer support surface 104₁ by, for example, capillary action, through the supply ports 113 to form the heat transfer layer D. The channel 108 may thus serve as at least a part of a cooler to cool and convert the heat transfer medium generation gas in the channel 115 to a heat transfer medium, and the gas supply unit 120 may serve as at least a part of a heat transfer layer formation unit to form the heat transfer layer D on the wafer support surface 104₁.

The upper electrode 102 also serves as a shower head that supplies one or more process gases from the gas supply unit 130 into the plasma processing space 100s. In one exemplary embodiment, the upper electrode 102 includes a gas inlet 102a, a gas-diffusion compartment 102b, and multiple gas ports 102c. The gas inlet 102a allows passage of fluid between the gas supply unit 130 and the gas-diffusion compartment 102b. The gas ports 102c allow passage of fluid between the gas-diffusion compartment 102b and the plasma processing space 100s. In one exemplary embodiment, the upper electrode 102 supplies various gases from the gas inlet 102a into the plasma processing space 100s through the gas-diffusion compartment 102b and the multiple gas ports 102c.

The gas supply unit 130 may include one or more gas sources 131 and one or more flow controllers 132. In one exemplary embodiment, the gas supply unit 130 supplies, for example, one or more process gases from the respective gas sources 131 to the gas inlet 102a through the corresponding flow controllers 132. Each flow controller 132 may include, for example, a mass flow controller or a pressure-based flow controller. The gas supply unit 130 may further include one or more flow rate modulators that supply one or more process gases at a modulated flow rate or in a pulsed manner.

An RF power supply unit 140 provides RF power, or for example, one or more RF signals, to one or more electrodes, such as the lower electrode 103, the upper electrode 102, or both the lower electrode 103 and the upper electrode 102. This causes plasma to be generated from one or more process gases supplied into the plasma processing space 100s. The RF power supply unit 140 may thus serve as at least a part of a plasma generator for generating plasma from one or more process gases in the plasma processing chamber 100.

The RF power supply unit 140 includes, for example, two RF generators 141a and 141b and two matching circuits 142a and 142b. In one exemplary embodiment, the RF power supply unit 140 provides a first RF signal from the first RF generator 141a through the first matching circuit 142a to the lower electrode 103. For example, the first RF signal may have a frequency of 27 to 100 MHz.

In one exemplary embodiment, the RF power supply unit 140 provides a second RF signal from the second RF generator 141b through the second matching circuit 142b to the lower electrode 103. For example, the second RF signal may have a frequency of 400 kHz to 13.56 MHz. Voltage pulses other than the RF may be provided in place of the second RF signal. The voltage pulses may be of a negative DC voltage. In some exemplary embodiments, the voltage pulses may be triangular wave pulses or impulses.

Although not illustrated, the present disclosure may be implemented in other exemplary embodiments. For example, in some exemplary embodiments, the RF power supply unit 140 may provide the first RF signal from an RF generator to the lower electrode 103, the second RF signal from another RF generator to the lower electrode 103, and a third RF signal from still another RF generator to the lower electrode 103. In some exemplary embodiments, the upper electrode 102 may receive a DC voltage.

In various exemplary embodiments, one or more RF signals (e.g., the first RF signal or the second RF signal) may have pulsed or modulated amplitudes. Such amplitude modulation may include pulse-amplitude modulation of an RF signal between an on-state and an off-state, or between two or more different on-states.

The exhaust system 150 may be connected to an outlet 100e in the bottom of the plasma processing chamber 100. The exhaust system 150 may include a pressure valve and a vacuum pump. The vacuum pump may include a turbomolecular pump, a roughing pump, or a combination of these.

The processing module 1 further includes a controller 160. In one exemplary embodiment, the controller 160 also processes computer-executable instructions that cause the processing module 1 to perform various steps described in one or more aspects of the present disclosure. The controller 160 may control the other components of the processing module 1 to perform various steps described herein. In one exemplary embodiment, some or all of the components of the controller 160 may be included in other components of the processing module 1. The controller 160 may include, for example, a computer 170. The computer 170 may include, for example, a processor (central processing unit or CPU) 171, a storage 172, and a communication interface 173. The CPU 171 may perform various control operations based on programs stored in the storage 172. The storage 172 may include a random-access memory (RAM), a read-only memory (ROM), a hard disk drive (HDD), a solid-state drive (SSD), or a combination of these. The communication interface 173 may communicate with other components of the processing module 1 through a communication line such as a local area network (LAN).

Wafer Processing in Processing Module 1

Figure 3:
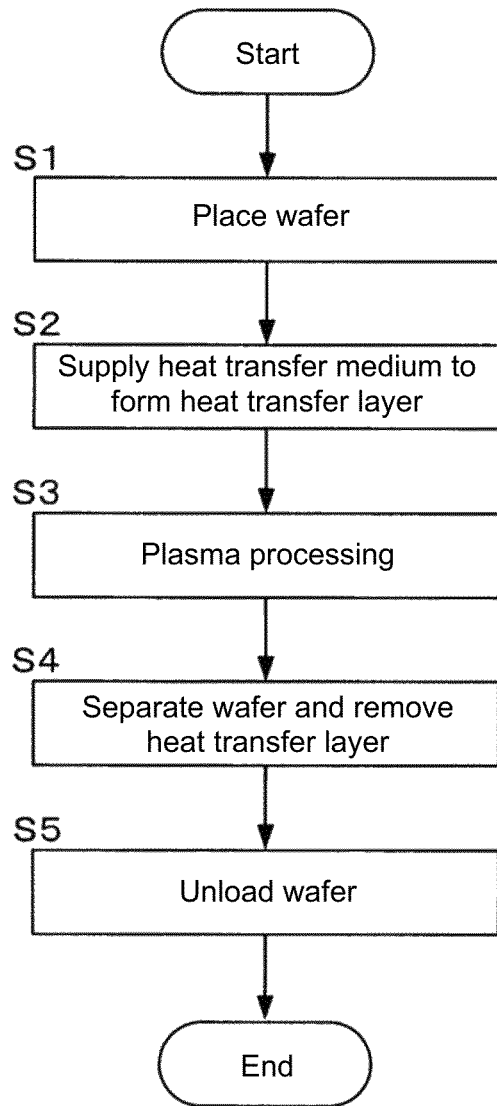
FIG. 3 is a flowchart of example wafer processing performed in the processing module in FIGS. 1 and 2.

Example wafer processing performed in the processing module 1 will now be described with reference to FIGS. 3 to 7. FIG. 3 is a flowchart of example wafer processing. FIGS. 4 to 7 are each a diagram of the processing module 1 in a processing state during the wafer processing. The processing described below is performed under the control of the controller 160.

Figure 4:
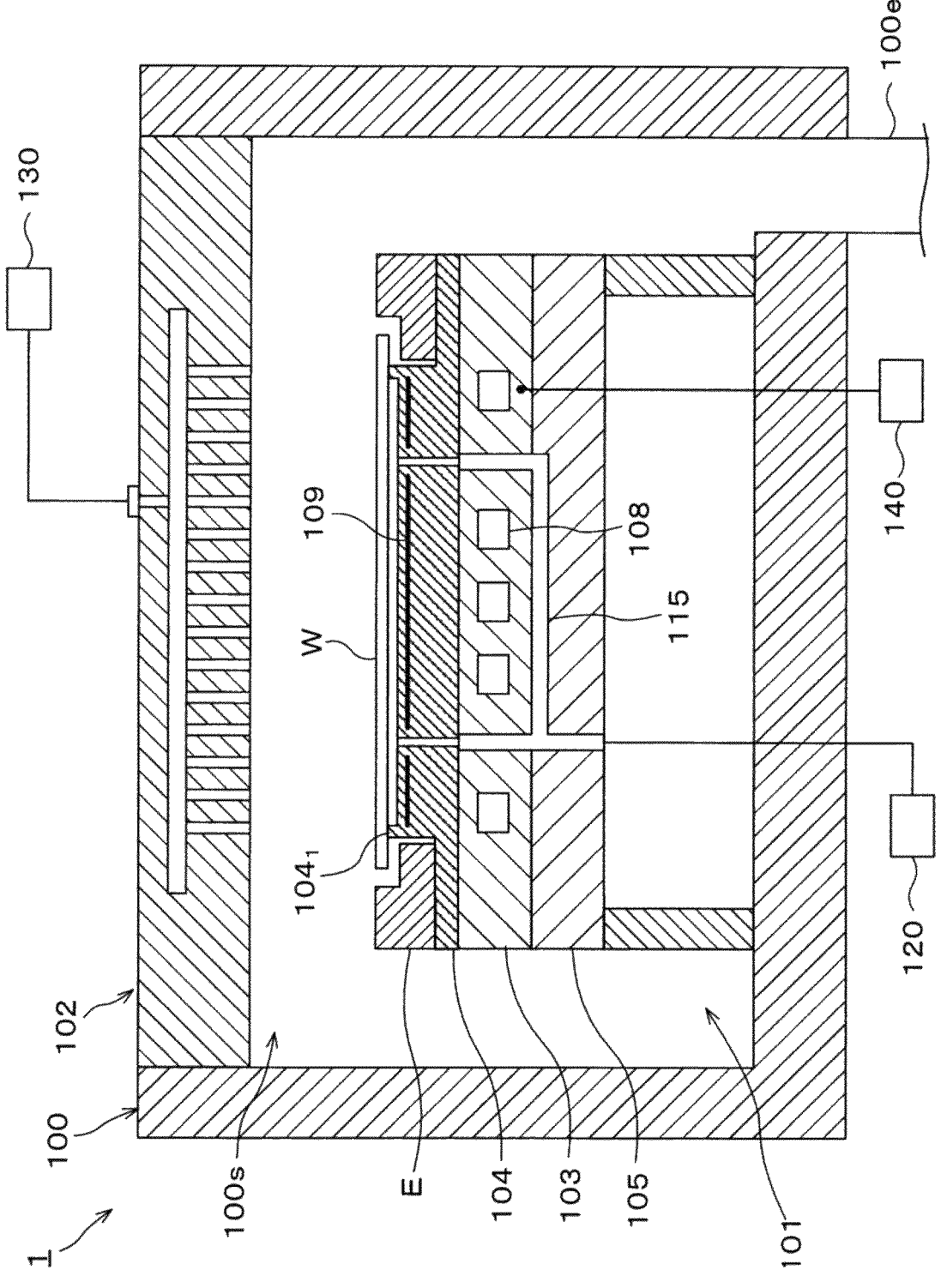
FIG. 4 is a diagram of the processing module in FIGS. 1 and 2 in a processing state during the wafer processing.

As shown, for example, in FIGS. 3 and 4, a wafer W is placed onto the wafer support surface $104_1$ of the wafer support 101 (step S1). More specifically, the wafer W is loaded into the plasma processing chamber 100 by the transferrer (not shown), and is placed onto the wafer support surface $104_1$ of the ESC 104 using the lifters 107 that can ascend or descend. The internal space of the plasma processing chamber 100 is then decompressed to a predetermined degree of vacuum (pressure p1) by the exhaust system 150.

Figure 5:
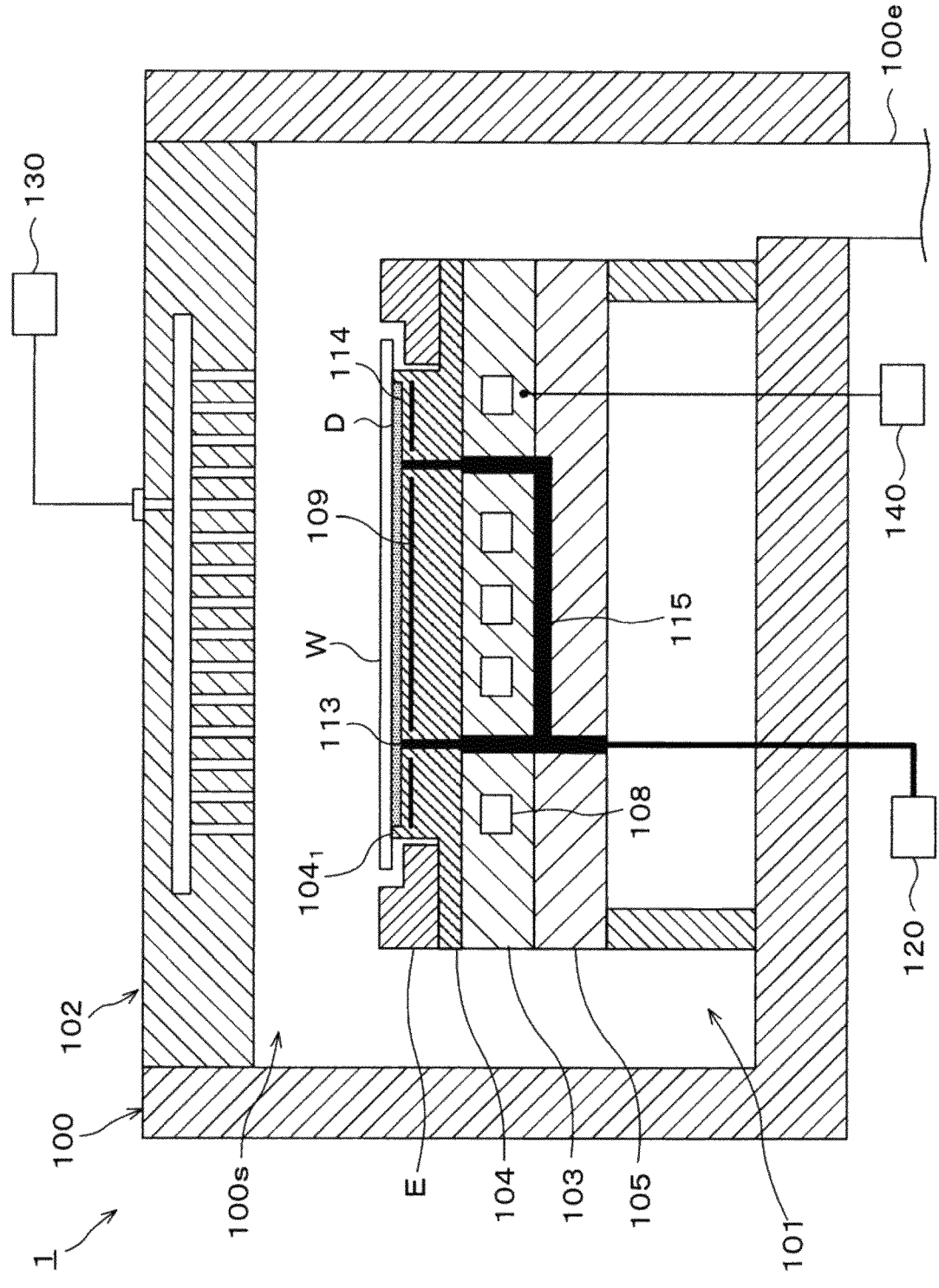
FIG. 5 is a diagram of the processing module in FIGS. 1 and 2 in a processing state during the wafer processing.

As shown in FIG. 5, the heat transfer medium including at least one of a liquid medium or a solid medium with fluidity is then supplied to between the wafer support surface $104_1$ and the back surface of the wafer W through the wafer support 101 to form the heat transfer layer D (step S2).

More specifically, the wafer W is held on the wafer support 101. For example, a DC voltage is applied to the electrode 109 in the ESC 104 to electrostatically clamp the wafer W with the ESC 104 with an electrostatic force. In this case, the temperature of the wafer support surface $104_1$ is adjusted to a temperature T1, and the temperature in the channel 115 is adjusted to the temperature T1 accordingly. The temperature T1 is set to a temperature at which the processing can be performed effectively. The temperature T1 may be, for example, equal to the temperature of the wafer support surface $104_1$ during the processing.

After the wafer W is held on the wafer support 101, a heat transfer medium generation gas is supplied from the gas supply unit 120 to the channel 115 in the wafer support 101 at a temperature T2 (>T1) and a pressure p2 (>p1). The heat transfer medium generation gas supplied to the channel 115 is cooled to the temperature T1 in the channel 115, and turns into a heat transfer medium including at least one of a liquid medium or a solid medium with fluidity. The heat transfer medium is then supplied to the wafer support surface $104_1$ by, for example, capillary action, through the supply ports 113. The heat transfer medium supplied to the wafer support surface $104_1$ spreads along the wafer support surface $104_1$ by capillary action, which results from a clearance between the wafer support surface $104_1$ and the back surface of the wafer W. This forms the heat transfer layer D. The heat transfer layer D is formed from a heat transfer medium including at least one of a liquid medium or a solid medium with fluidity, and thus is deformable.

With a clearance between the wafer support surface $104_1$ and the back surface of the wafer W being too narrow, the heat transfer medium may not spread along the wafer support surface $104_1$ by capillary action, depending on the viscosity of the heat transfer medium. As described above, the grooves 114 on the wafer support surface $104_1$ widen the clearance between the wafer support surface $104_1$ and the back surface of the wafer W. This allows the heat transfer medium to spread appropriately along the wafer support surface $104_1$ by capillary action. To facilitate transfer of the heat transfer medium by capillary action, a medium with low viscosity may be used as the heat transfer medium.

The supply of the heat transfer medium to the wafer support surface $104_1$ (more specifically, the supply of the heat transfer medium generation gas from the gas supply unit 120) is stopped when, for example, the supply amount reaches a predetermined amount (more specifically, when the supply time of the heat transfer medium generation gas from the gas supply unit 120 exceeds a predetermined time). For example, a monitor such as a camera may be used to monitor leakage of the heat transfer medium from between the wafer support surface $104_1$ and the back surface of the wafer W. When leakage is detected, the supply of the heat transfer medium to the wafer support surface $104_1$ may be stopped. In this case, the monitor such as a camera located, for example, outside the plasma processing chamber 100 monitors leakage, or specifically, captures images, through an optical window in the plasma processing chamber 100.

Plasma processing is then performed on the wafer W on the wafer support surface $104_1$ on which the heat transfer layer D is formed (step S3). More specifically, plasma processing is performed on the wafer W with the heat transfer layer D between the wafer W and the wafer support surface $104_1$.

Figure 6:
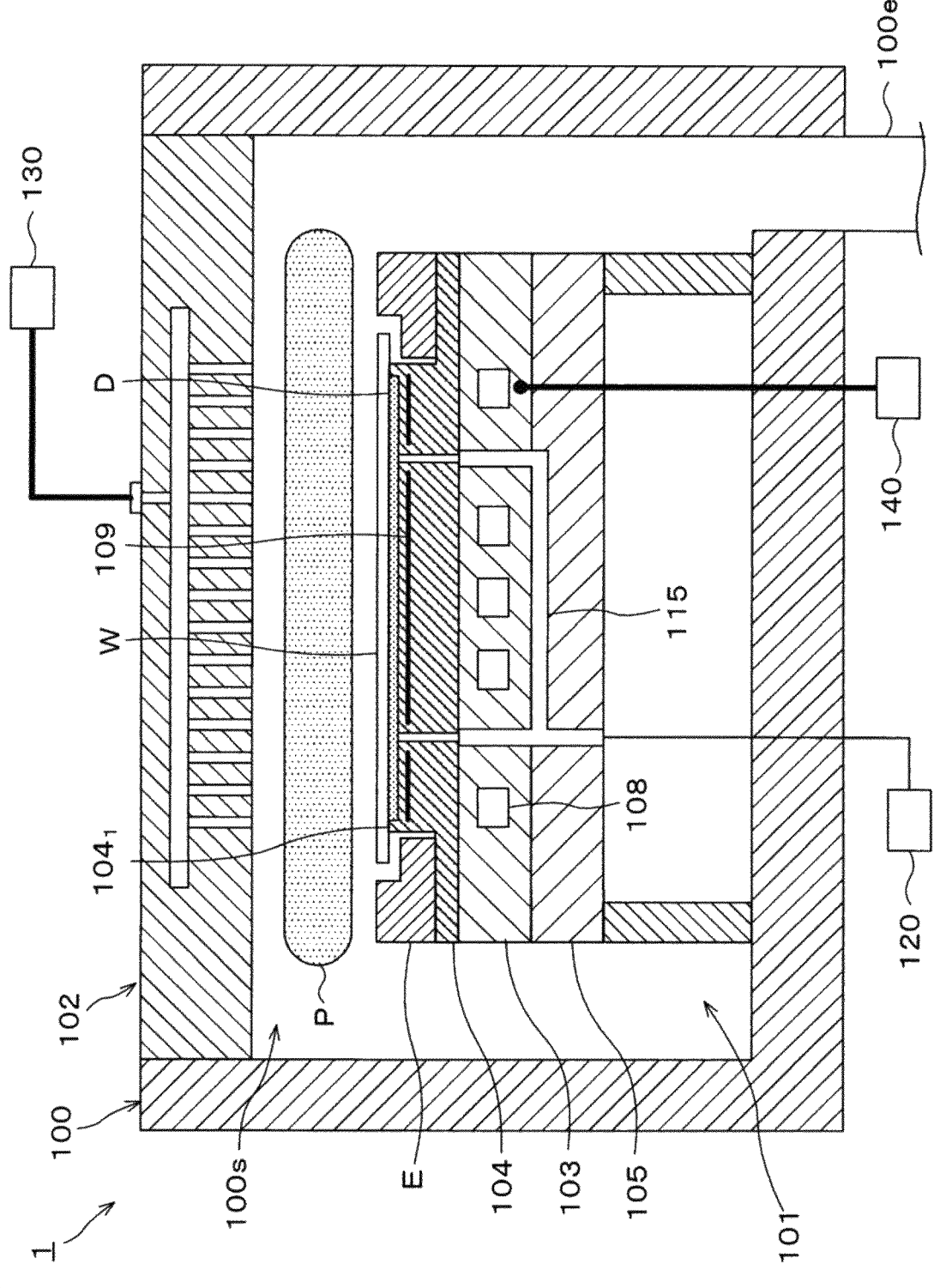
FIG. 6 is a diagram of the processing module in FIGS. 1 and 2 in a processing state during the wafer processing.

More specifically, as shown in, for example, FIG. 6, a process gas is supplied from the gas supply unit 130 through the upper electrode 102 into the plasma processing space 100s, and RF power HF for plasma generation is provided from the RF power supply unit 140 to the lower electrode 103, with the wafer W remaining on the wafer support 101. This excites the process gas and generates plasma P. In this state, RF power LF for drawing ions may be provided from the RF power supply unit 140. The generated plasma P then causes plasma processing on the wafer W.

During plasma processing, the wafer support surface $104_1$ is adjusted to the predetermined temperature T1 with the temperature adjusting fluid flowing through the channel 108 to adjust the temperature of the wafer W. During plasma processing, the wafer W is on the wafer support surface $104_1$ with the heat transfer layer D in between. The heat transfer layer D is deformable as described above, allowing the lower surface, or the back surface, of the wafer W to be in close contact with the heat transfer layer D. The heat transfer layer D is formed from the heat transfer medium including at least one of a liquid medium or a solid medium with fluidity. The heat transfer layer D thus has higher thermal conductivity than a heat transfer gas, such as He. With the heat transfer layer D, the temperature of the wafer W can be adjusted more efficiently with the wafer support surface $104_1$ than when a heat transfer gas, such as He, is supplied to between the wafer support surface $104_1$ and the back surface of the wafer W. More specifically, when a large amount of heat is input from the plasma P to the wafer W during plasma processing, the wafer W can be maintained at a constant temperature by adjusting the temperature of the wafer support surface $104_1$. When the set temperature of the wafer W is changed during plasma processing, the temperature of the wafer W can be immediately adjusted to the changed set temperature by adjusting the temperature of the wafer support surface $104_1$. When the wafer W is held on the wafer support 101 under an electrostatic force during plasma processing, the degree of contact of the wafer W with the wafer support 101 may be controlled using the electrostatic force to control heat removal from the wafer W through the wafer support 101.

A pressure p3 applied to the heat transfer layer D during plasma processing is 0.1 to 100 Torr, including the pressure applied to the heat transfer layer D by electrostatically clamping the wafer W. During plasma processing, a DC voltage may be applied to the electrodes for electrostatically clamping the edge ring in the ESC 104. This causes the ESC 104 to electrostatically clamp the edge ring E. During plasma processing, a heat transfer gas may be supplied to the back surface of the edge ring E through gas supply holes (not shown) in the peripheral upper surface $104_2$ of the ESC 104.

To end the plasma processing, the supply of the RF power HF from the RF power supply unit 140 and the supply of the process gas from the gas supply unit 130 are stopped. When RF power LF is provided during plasma processing, the supply of the RF power LF is also stopped. The internal space of the plasma processing chamber 100 is then decompressed to a predetermined degree of vacuum (pressure p1) by the exhaust system 150. The above pressure p1 is, for example, less than 0.001 Torr. When the edge ring E is electrostatically clamped by the ESC 104 and the heat transfer gas is supplied to the back surface of the edge ring E during plasma processing, at least one of these operations may also be stopped.

Figure 7:
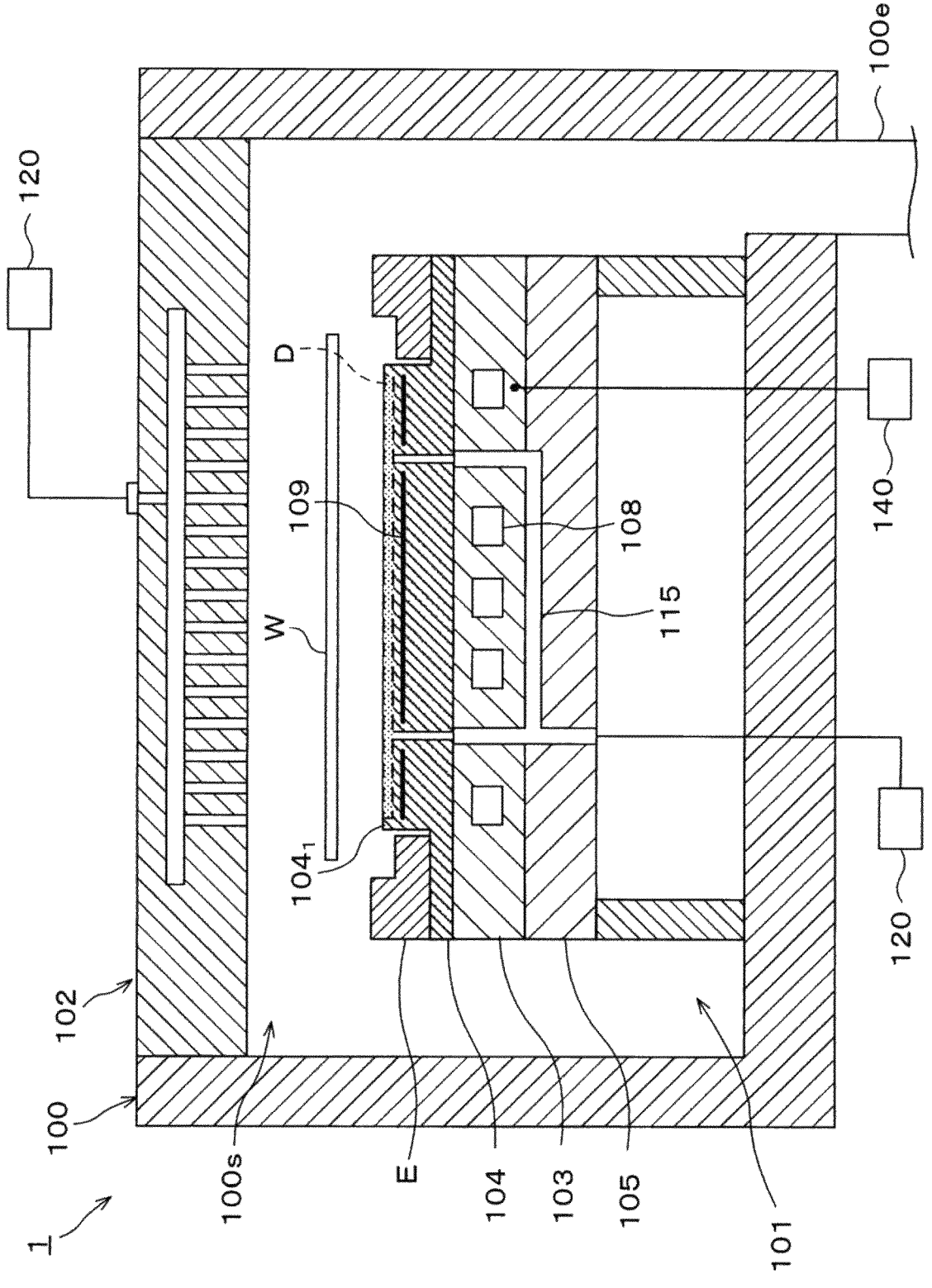
FIG. 7 is a diagram of the processing module in FIGS. 1 and 2 in a processing state during the wafer processing.

After plasma processing, the wafer W is separated from the wafer support surface $104_1$, and the heat transfer layer D is vaporized and removed (step S4). In one example, the heat transfer layer D is removed through vaporization. More specifically, after the holding of the wafer W on the wafer support 101 (e.g., electrostatic clamping of the wafer W with the ESC 104) is stopped, the wafer W is raised by the lifters 107 to be separate from the wafer support surface $104_1$, as shown in FIG. 7. Once the wafer W is separated, the heat transfer layer D is exposed to a decompressed atmosphere, or more specifically, to an atmosphere with the pressure p1 of less than 0.001 Torr, thus being vaporized and removed.

To enable such vaporization, the heat transfer medium forming the heat transfer layer D is a liquid or a solid with fluidity at the temperature T1 with the pressure p3 of 0.1 to 100 Torr and a gas at the temperature T1 with the pressure p1 of less than 0.001 Torr.

The heat transfer medium generation gas that forms the heat transfer medium for the heat transfer layer D includes, for example, at least one of boron (B) or carbon (C), which is a constituent atom of the heat transfer layer D, and at least one of hydrogen (H), nitrogen (N), or oxygen (O), which is a gas component. The heat transfer medium generation gas may contain components that do not interfere with plasma processing. At least one of exposure of the heat transfer layer D to plasma, heating of the heat transfer layer D, or light irradiation onto the heat transfer layer D may be used to remove the heat transfer layer D from the wafer support surface $104E_1$, in place of or in addition to exposure of the heat transfer layer D to a decompressed atmosphere.

The wafer W is then unloaded (step S5). More specifically, the wafer W is transferred from the lifters 107 to the transferrer (not shown), and is unloaded from the plasma processing chamber 100 by the transferrer. This completes the wafer processing.

Exemplary Advantageous Effects and Others

In the present exemplary embodiment, as described above, the heat transfer medium including at least one of a liquid medium or a solid medium with fluidity is supplied to between the wafer support surface $104_1$ and the back surface of the wafer W through the wafer support 101 to form the heat transfer layer D during plasma processing. The heat transfer layer D is formed from the heat transfer medium as described above, and thus has higher thermal conductivity than a heat transfer layer formed from a heat transfer gas. The heat transfer layer D is deformable as described above and can thus be closely in contact with the lower surface of the wafer W. In the present exemplary embodiment, heat can thus be efficiently exchanged between the wafer W and the wafer support surface $104_1$ through the heat transfer layer D. The temperature of the wafer W is efficiently adjustable through the wafer support surface $104_1$ during plasma processing. More specifically, during plasma processing, the wafer support surface $104_1$ can efficiently absorb heat from the wafer W through the heat transfer layer D, and the wafer support surface $104_1$ can efficiently heat the wafer W through the heat transfer layer D.

In the present exemplary embodiment, the heat transfer medium forming the heat transfer layer D includes a liquid or a solid with fluidity, and thus the above heat transfer medium is less likely to clog the channel 115. When the wafer W is separated from the wafer support surface $104_1$, the heat transfer layer D is vaporized and removed. No step for removing the heat transfer layer D is used separately, improving throughput.

In the present exemplary embodiment, the wafer W is electrostatically clamped onto the wafer support surface $104_1$ with an electrostatic force from the ESC 104 during plasma processing. This allows the heat transfer layer D and the lower surface of the wafer W to be in closer contact with each other, further improving the efficiency of heat removal from the wafer W or the efficiency of heating the wafer W through the wafer support surface $104_1$ and the heat transfer layer D. As described above, the ESC 104 electrostatically clamping the wafer W allows the heat transfer layer D to be in close contact with the lower surface of the wafer W when the wafer W is warped. Thus, with the wafer W being warped, the heat may be efficiently removed from the wafer W or the wafer W may be heated efficiently.

Modifications of Heat Transfer Medium Supply

Figure 8:
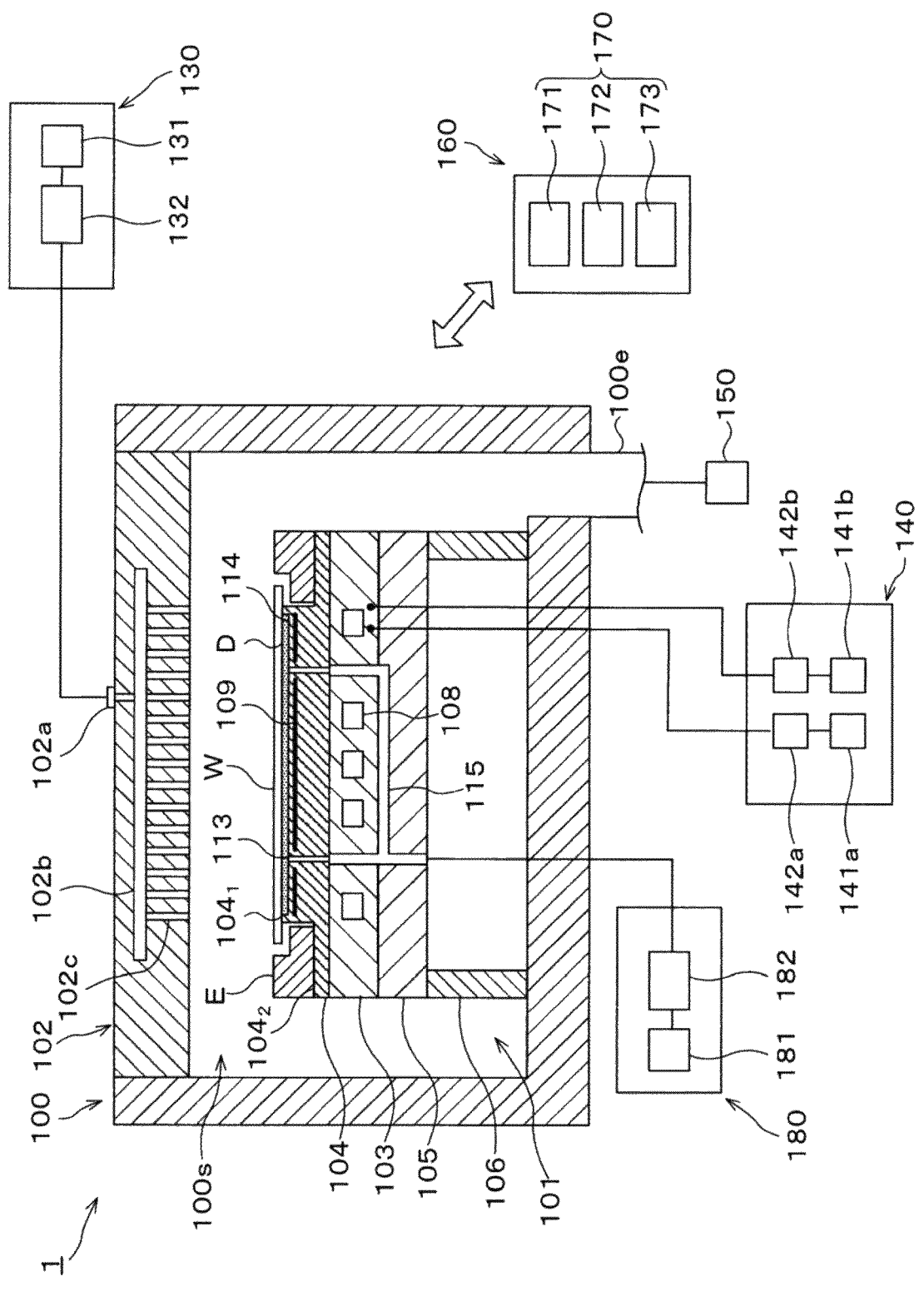
FIG. 8 is a diagram describing another example of supply of a heat transfer medium.

FIG. 8 is a diagram describing another example of supply of a heat transfer medium. In the above example, the heat transfer medium generation gas is supplied from outside to the wafer support 101 and is converted to a heat transfer medium in the wafer support 101. As shown in FIG. 8, however, a medium supply unit 180 may supply the heat transfer medium to the wafer support 101 (more specifically, to the channel 115).

The medium supply unit 180 may include one or more sources 181 of the heat transfer media and one or more flow controllers 182. In one exemplary embodiment, the medium supply unit 180 supplies, for example, one or more heat transfer media from the respective sources 181 to the wafer support 101 through the corresponding flow controllers 182. The medium supply unit 180 may further include one or more flow rate modulators that supply one or more heat transfer media at a modulated flow rate or in a pulsed manner.

In the above example, the supply of the heat transfer medium in the wafer support 101 to the wafer support surface 104₁ is performed by capillary action. In some exemplary embodiments, a supply pressure of the heat transfer medium generation gas from outside to the wafer support 101 or the supply pressure of the heat transfer medium from outside to the wafer support 101 may be used to supply the heat transfer medium in the wafer support 101 to the wafer support surface 104₁.

Modifications of Heat Transfer Medium

As described above, when the supply pressure of the heat transfer medium from outside to the wafer support 101 is used to supply the heat transfer medium in the wafer support 101 to the wafer support surface 104₁, any of the heat transfer media described below may be used. For example, a heat transfer medium mixed with a powder with higher thermal conductivity than the base material of the heat transfer medium may be used. The powder with higher thermal conductivity than the base material of the heat transfer medium is, for example, a carbon nanotube powder.

When the supply pressure of the heat transfer medium generation gas from outside to the wafer support 101 is used to supply the heat transfer medium in the wafer support 101 to the wafer support surface 104₁, a mist including a powder with the thermal conductivity described above may be used as the heat transfer medium generation gas. Cooling the heat transfer medium generation gas in the channel 115 allows the heat transfer medium to be converted to a heat transfer medium mixed with a powder with high thermal conductivity, thus allowing the heat transfer medium to be supplied to the wafer support surface 104₁.

Specific Example of Grooves 114

Figure 9:
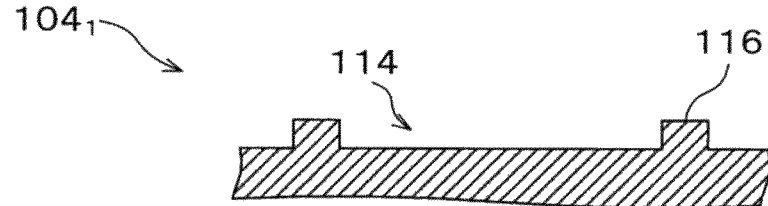
FIG. 9 is a diagram of a specific example of grooves.
Figure 10:
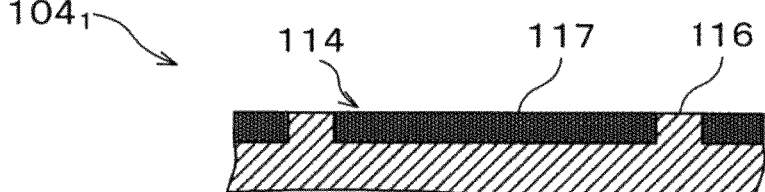
FIG. 10 is a diagram of the specific example of the grooves.

FIGS. 9 and 10 are each a diagram showing a specific example of the grooves 114. As shown in FIG. 9, the ESC 104 may include, on the wafer support surface 104₁, multiple support posts 116 that support the back surface of the wafer W. In this case, for example, recesses between the support posts 116 define the grooves 114. Each groove 114 may be filled with a porous material (more specifically, a porous ceramic material) 117 as shown in FIG. 10. This allows the wafer W to maintain its shape when electrostatically clamped by the ESC 104, independently of the shape of the groove 114. When the porous material 117 is used, the heat transfer medium flows through the pores in the porous material 117 by capillary action, thus spreading along the wafer support surface 104₁.

Other Examples of Wafer Support Surface

In the present exemplary embodiment, the wafer support surface may include portions formed from a porous material located other than the grooves 114 (more specifically, for example, the top of the support posts 116). When the grooves 114 are not located on the wafer support surface, the wafer support surface may be entirely formed from the porous material.

Other Examples of Formation of Heat Transfer Layer D

In the present exemplary embodiment, the heat transfer layer D is formed on the entire wafer support surface 104₁, including, for example, the central area and the peripheral area of the wafer support surface 104₁. In some exemplary embodiments, the heat transfer layer D may be formed on a part of the wafer support surface 104₁. For example, when heat is to be removed from or to be added to the center portion of the wafer W, the heat transfer layer D may be formed on the central area of the wafer support surface 104₁ facing the center portion of the wafer W. For example, when heat is to be removed from or to be added to the periphery of the wafer W, the heat transfer layer D may be formed on the peripheral area of the wafer support surface 104₁ facing the periphery of the wafer W. For example, the grooves 114 may be located in an area, for example, the central area, on the wafer support surface 104₁. This allows the heat transfer layer D to be formed on the area.

In the present exemplary embodiment, the heat transfer layer D has a uniform thickness across the entire wafer support surface 104₁ including, for example, the central area and the peripheral area of the wafer support surface 104₁. In some exemplary embodiments, the heat transfer layer D may have different thicknesses within the plane of the wafer support surface 104₁. For example, when heat is to be removed from or to be added to the center portion of the wafer W, the heat transfer layer D may be thinner on the central area of the wafer support surface 104₁ facing the center portion of the wafer W than on the peripheral area. For example, when heat is to be removed from or to be added to the periphery of the wafer W, the heat transfer layer D may be thinner on the peripheral area of the wafer support surface 104₁ facing the periphery of the wafer W than on the central area. Thus, the heat transfer layer D being partially thinner on, for example, the central area of the wafer support surface 104₁ allows the heat exchange efficiency between the wafer support surface 104₁ and the wafer W to vary within the plane. The heat exchange efficiency can thus be partially increased in the area.

When the grooves 114 are located on the wafer support surface 104₁, the grooves 114 may have different depths in different areas on the wafer support surface 104₁, allowing the heat transfer layer D to be thinner in an area, for example, the central area.

When the grooves 114 are not located on the wafer support surface 104₁ and the wafer support surface 104₁ is entirely formed from a porous material, the porous material may have different thicknesses in different areas on the wafer support surface 104₁. This also allows the heat exchange efficiency between the wafer support surface 104₁ and the wafer W to vary within the plane, as in the structure with the grooves 114 having different depths in different areas on the wafer support surface 104₁.

The heat transfer layer D may be formed from a conductive medium with high thermal conductivity and a conductive medium with low thermal conductivity mixed together. In this case, the mixing ratio of these conductive media may be different in different areas on the wafer support surface 104₁. This also allows the heat exchange efficiency between the wafer support surface 104₁ and the wafer W to vary within the plane.

The density of the grooves 114 may be different in different areas on the wafer support surface 104₁. In other words, when the recesses between the support posts 116 define the grooves 114, the density of the support posts 116 may vary for each area on the wafer support surface 104₁. This allows the ratio of the portion in which the heat transfer layer is formed to the other portions to vary in different areas of the wafer support surface 104₁, allowing the heat exchange efficiency between the wafer support surface 104₁ and the wafer W to vary within the plane.

Electrical Characteristics of Heat Transfer Layer D

The heat transfer layer D may be electrically insulating. The heat transfer layer D thus has a residual charge, which can be used for electrostatically clamping the wafer W. The heat transfer layer D may be conductive. The heat transfer layer D can thus remove a residual charge on the wafer W. The heat transfer layer D may include a conductive portion surrounded by an electrically insulating portion. This structure allows high thermal conductivity in the conductive portion (typically, the conductivity is higher as the thermal conductivity is higher) and electrostatic clamping of the wafer W in the electrically insulating portion with the residual charge generated in the electrically insulating portion.

Other Modifications of First Exemplary Embodiment

The wafer support surface 104₁ of the wafer support 101 may have a uniform height between the central area and the peripheral area, or may be macroscopically flat. In some exemplary embodiments, the wafer support surface may be higher in the central area or higher in the peripheral area.

For the wafer support surface 104₁ with a convex shape having a higher central area, a wafer W having a higher temperature than the wafer support surface 104₁ may be placed onto the wafer support surface 104₁ and cooled from the back surface to thermally deform into a convex shape. The wafer W and the wafer support surface 104₁ can then come in close contact with each other. For the wafer support surface 104₁ with a concave shape having a lower central area, a wafer W having a lower temperature than the wafer support surface 104₁ may be placed onto the wafer support surface 104₁ and heated from the back surface to thermally deform into a concave shape. The wafer W and the wafer support surface 104₁ can then come in close contact with each other.

As described above, the heat transfer layer D may be formed on the entire wafer support surface 104₁, or on a part of the wafer support surface 104₁ (more specifically, either the central area or the peripheral area). A heat transfer gas, such as a He gas, may be supplied to an area of the wafer support surface 104₁ without the heat transfer layer D.

In the above example, the ESC 104 is used as a fastener that holds or fastens the wafer W on the wafer support surface 104₁. The ESC 104 electrostatically clamps the wafer W with an electrostatic force generated by a DC voltage applied to the internal electrode 109. The fastener that electrically holds or fastens the wafer W may not use an electrostatic force. In some exemplary embodiments, the fastener may hold the wafer W with a Johnsen-Rahbek force. The above fastener may hold the wafer W in any manner other than the electrical manner described above. For example, the above fastener may be a fastener, such as a clamp, to physically hold the wafer W. The clamp holds and fastens the wafer W between the clamp and the wafer support 101. The above fastener may be eliminated.

Second Exemplary Embodiment

Plasma Processing System

Figure 11:
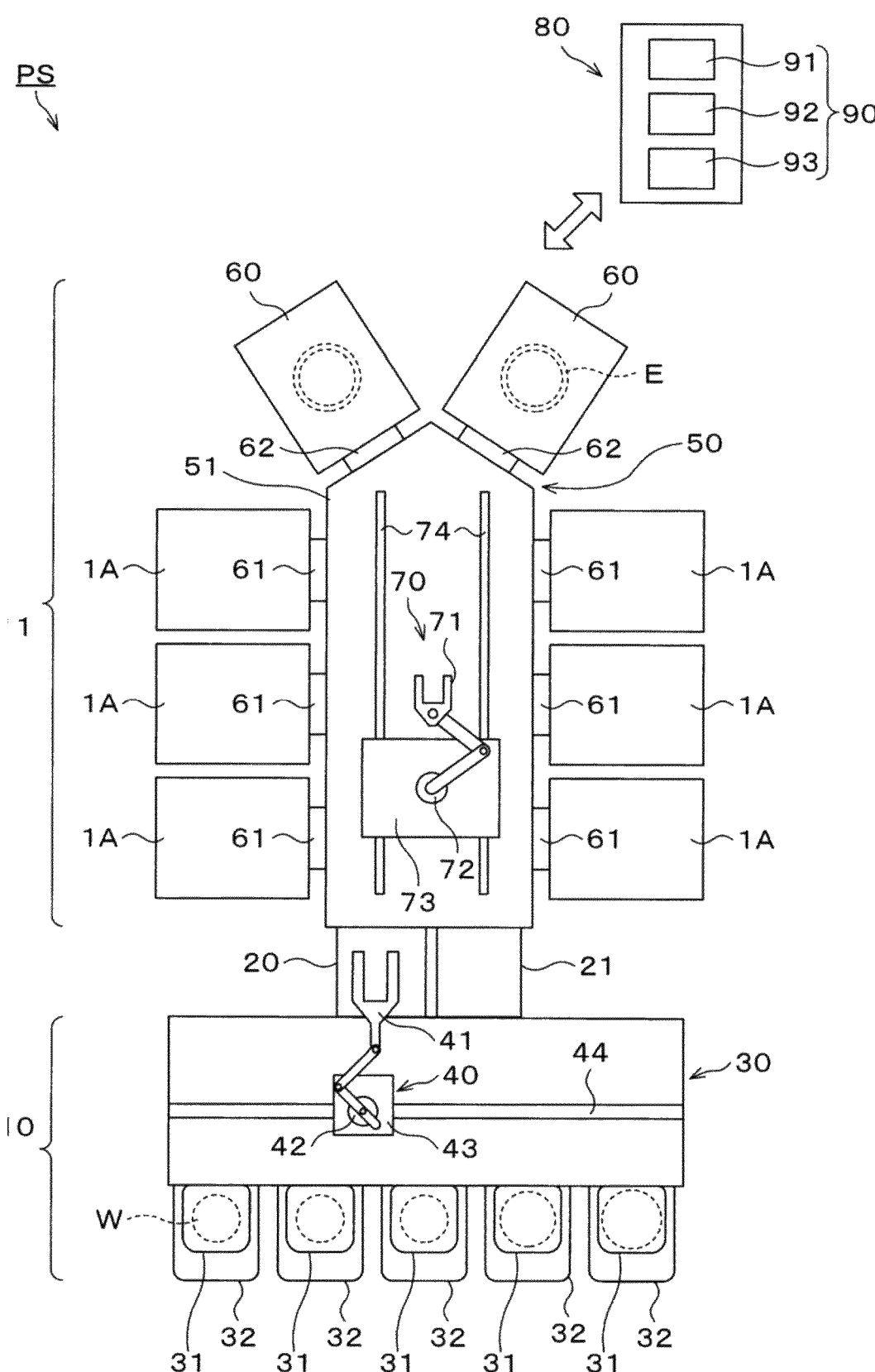
FIG. 11 is a schematic plan view of a plasma processing system including a processing module as a plasma processing apparatus according to a second exemplary embodiment.

FIG. 11 is a schematic plan view of a plasma processing system including a processing module as a plasma processing apparatus according to a second exemplary embodiment.

A plasma processing system PS in FIG. 11 includes an atmospheric unit 10 and a decompressor 11, which are connected together with loadlock modules 20 and 21 in between. The atmospheric unit 10 includes an atmospheric module in which intended processing is performed on a wafer W as a substrate under an atmospheric pressure. The decompressor 11 includes processing modules 1A in which intended processing is performed on the wafer W under a decompressed atmosphere (vacuum atmosphere).

The loadlock modules 20 and 21 connect a loader module 30 included in the atmospheric unit 10 and a transfer module 50 included in the decompressor 11 with a gate valve (not shown). The loadlock modules 20 and 21 temporarily hold the wafer W. The loadlock modules 20 and 21 can switch their internal spaces between the atmospheric pressure and the decompressed atmosphere.

The atmospheric unit 10 includes the loader module 30 including a transferrer 40 (described later) and load ports 32 to receive front-opening unified pods (FOUP) 31. Each FOUP 31 can store multiple wafers W. The loader module 30 may be connected to an orienter module (not shown) that adjusts the horizontal orientation of a wafer W and a buffer module (not shown) that temporarily stores multiple wafers W.

The loader module 30 includes a rectangular housing with an internal space maintained at the atmospheric pressure. The multiple load ports 32, for example, five load ports 32, are aligned in one side surface, which is a long side of the housing of the loader module 30. The loadlock modules 20 and 21 are aligned on the other side surface, which is another long side of the housing of the loader module 30.

The transferrer 40 for transferring a wafer W is located in the housing of the loader module 30. The transferrer 40 includes a transfer arm 41 that supports a wafer W during transfer, a rotary stand 42 supporting the transfer arm 41 in a rotatable manner, and a base 43 receiving the rotary stand 42. The loader module 30 includes a guide rail 44 extending in the longitudinal direction of the loader module 30. The base 43 is located on the guide rail 44, along which the transferrer 40 is movable.

The decompressor 11 includes the transfer module 50 that transfers the wafers W and the edge rings E, the processing modules 1A as plasma processing apparatuses that perform plasma processing on the wafers W transferred from the transfer module 50, and a storage module 60 as a storage that stores the edge rings E. The internal spaces of the transfer module 50 and the processing modules 1 (more specifically, the internal spaces of a decompressed transfer chamber 51 and a plasma processing chamber 100 described later) are maintained in the decompressed atmosphere, and the internal space of the storage module 60 is also maintained in the decompressed atmosphere. The single transfer module 50 receives multiple (e.g., six) processing modules 1A and multiple (e.g., two) storage modules 60.

The transfer module 50 includes the decompressed transfer chamber 51 defined by a polygonal (pentagonal in the illustrated example) housing. The decompressed transfer chamber 51 is connected to the loadlock modules 20 and 21. The transfer module 50 transfers a wafer W loaded into the loadlock module 20 to one processing module 1A, and unloads a wafer W on which intended plasma processing is performed in the processing module 1A to the atmospheric unit 10 through the loadlock module 21. The transfer module 50 transfers an edge ring E in the storage module 60 to one processing module 1A and also unloads an edge ring E to be replaced in the processing module 1A to the storage module 60.

Each processing module 1A is connected to the transfer module 50 with a gate valve 61. The differences between the processing module 1A and the processing module 1 described with reference to FIG. 1 and other figures will be described later.

Each storage module 60 is connected to the transfer module 50 with a gate valve 62.

A transferrer 70 for transferring a wafer W and an edge ring E is located in the decompressed transfer chamber 51 in the transfer module 50. The transferrer 70 includes, similarly to the transferrer 40 described above, a transfer arm 71 that supports a wafer W and an edge ring E during transfer, a rotary stand 72 supporting the transfer arm 71 in a rotatable manner, and a base 73 receiving the rotary stand 72. The transfer module 50 includes guide rails 74 extending in the longitudinal direction of the transfer module 50 in the decompressed transfer chamber 51. The base 73 is located on the guide rails 74, along which the transferrer 70 is movable.

In the transfer module 50, the transfer arm 71 receives a wafer W held in the loadlock module 20 and loads the wafer W into the processing module 1A. The transfer arm 71 also receives a wafer held in the processing module 1A and transfers the wafer W to the loadlock module 21. In the transfer module 50, the transfer arm 71 receives an edge ring E from the storage module 60 and loads the edge ring E into the processing module 1A. The transfer arm 71 also receives an edge ring E held in the processing module 1A and unloads the edge ring E to the storage module 60.

The plasma processing system PS further includes a controller 80. In one exemplary embodiment, the controller 80 also processes computer-executable instructions that cause the plasma processing system PS to perform various steps described in one or more aspects of the present disclosure. The controller 80 may control the other components of the plasma processing system PS to perform various steps described herein. In one exemplary embodiment, some or all of the components of the controller 80 may be included in the other components of the plasma processing system PS. In one exemplary embodiment, the controller 80 also processes computer-executable instructions that cause the processing module 1A to perform various steps described in one or more aspects of the present disclosure. The controller 80 may control the components of the processing module 1A to perform various steps described herein. In one exemplary embodiment, some or all of the components of the controller 80 may be included in the other components of the processing module 1A. The controller 80 may include, for example, a computer 90. The computer 90 may include, for example, a processor (CPU) 91, a storage 92, and a communication interface 93. The CPU 91 may perform various control operations based on programs stored in the storage 92. The storage 92 may include a RAM, a ROM, an HDD, an SSD, or a combination of these. The communication interface 93 may communicate with the other components of the plasma processing system PS through a communication line such as a LAN.

Wafer Processing in Plasma Processing System PS

The wafer processing performed in the plasma processing system PS described above will now be described.

First, a wafer W is removed from an intended FOUP 31 with the transferrer 40 and loaded into the loadlock module 20. The loadlock module 20 is then sealed and decompressed. The internal space of the loadlock module 20 is then connected with the internal space of the transfer module 50.

The wafer W is then held by the transferrer 70 and transferred from the loadlock module 20 to the transfer module 50.

The wafer W is then loaded into an intended processing module 1A by the transferrer 70 through the corresponding gate valve 61 that is open. The gate valve 61 is then closed and intended processing is performed on the wafer W in the processing module 1A. The processing performed on the wafer W in the processing module 1A will be described later.

The gate valve 61 is then opened, and the wafer W is unloaded from the processing module 1A by the transferrer 70. The gate valve 61 is then closed.

The wafer W is then loaded into the loadlock module 21 by the transferrer 70. In response to the wafer W being loaded into the loadlock module 21, the loadlock module 21 is sealed and vented to the atmosphere. The internal space of the loadlock module 21 is then connected with the internal space of the loader module 30.

The wafer W is held by the transferrer 40 and returned from the loadlock module 21 through the loader module 30 to an intended FOUP 31 for storage. This completes the wafer processing in the plasma processing system PS.

Processing Module 1A

Figure 12:
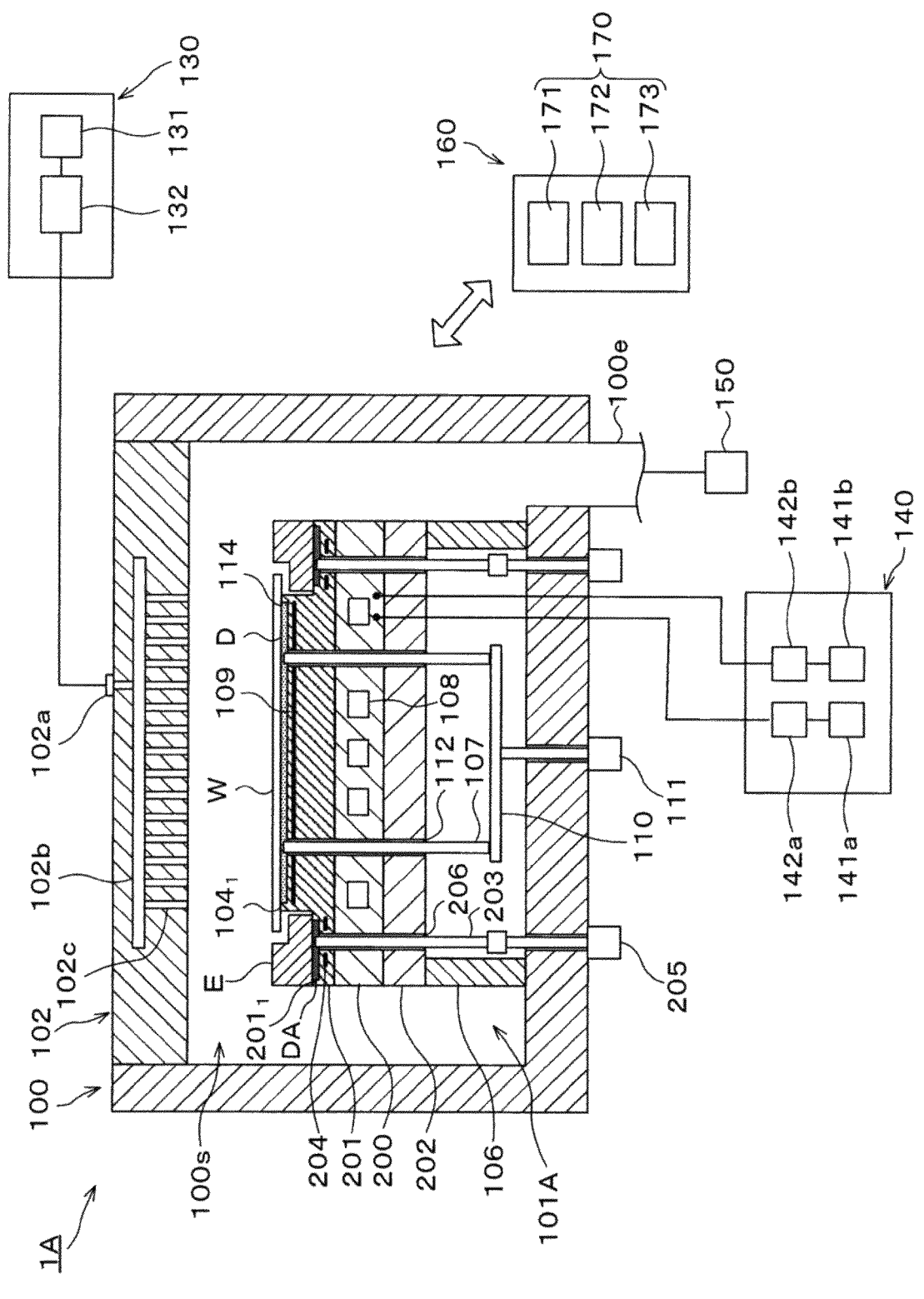
FIG. 12 is a schematic longitudinal cross-sectional view of the processing module as the plasma processing apparatus according to the second exemplary embodiment.
Figure 13:
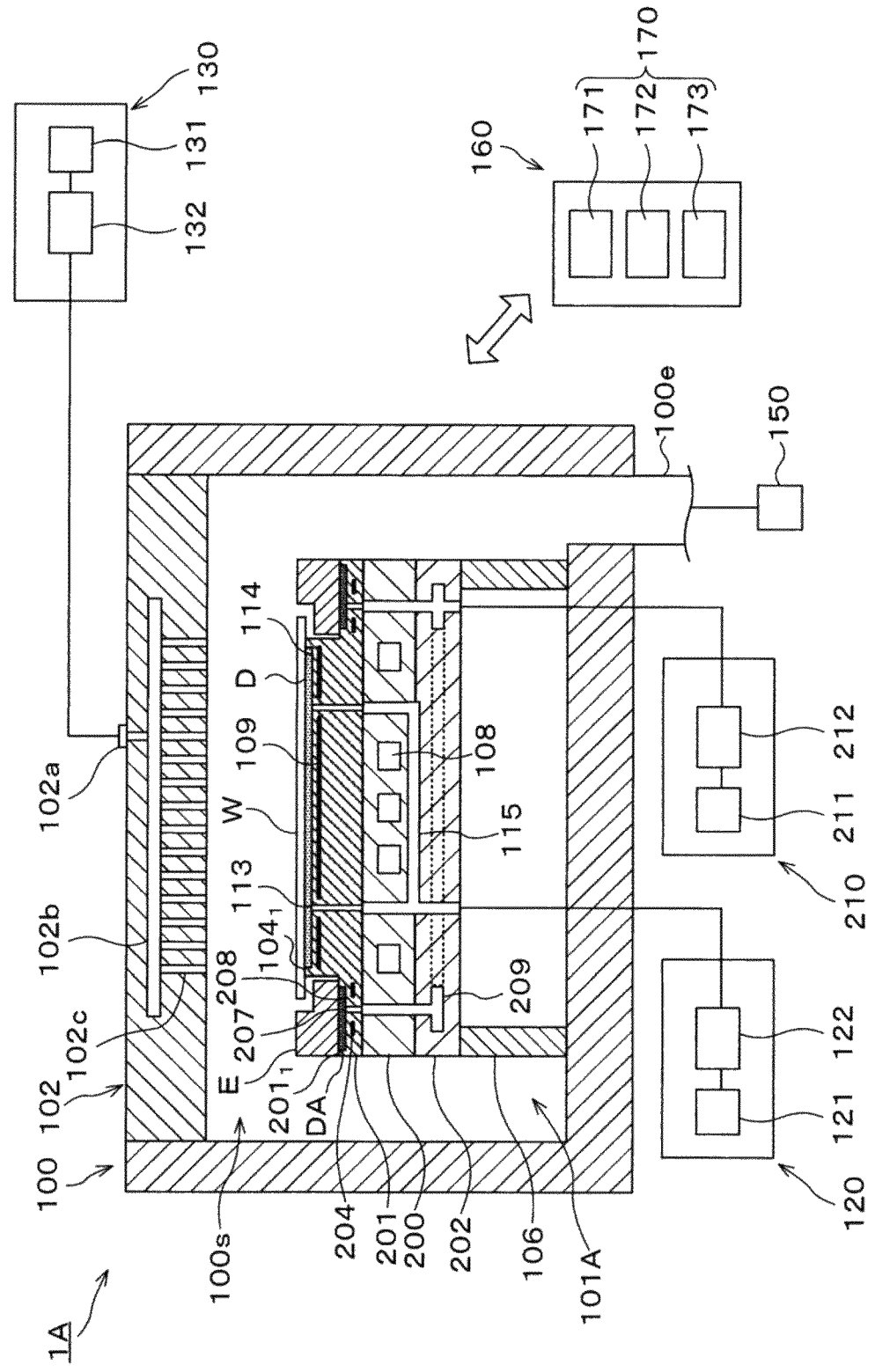
FIG. 13 is a schematic longitudinal cross-sectional view of the processing module as the plasma processing apparatus according to the second exemplary embodiment.

FIGS. 12 and 13 are each a schematic longitudinal cross-sectional view of the processing module 1A. FIGS. 12 and 13 show the wafer support 101A in a cross section focusing on the components different from each other.

In the processing module 1 in FIGS. 1 and 2, the wafer W undergoes temperature adjustment through the wafer support 101 and the heat transfer layer D formed from the heat transfer medium. In contrast, in the processing module 1A in FIGS. 12 and 13, the wafer W as well as the edge ring E undergo the above temperature adjustment. The processing module 1A in FIGS. 12 and 13 thus differs from the processing module 1 in FIGS. 1 and 2 mainly in the structure of the wafer support. The processing module 1A will be described focusing on the difference.

The processing module 1A includes a wafer support 101A including, for example, a lower electrode 200, an ESC 201, an insulator 202, legs 106, and lifters 107 and 203.

Similarly to the ESC 104 in FIG. 1, the ESC 201 has a wafer support surface $104_1$ in a center portion and a peripheral upper surface $201_1$ serving as a ring support surface on which an edge ring E is placeable.

The ESC 201 is an example fastener that fastens the edge ring E to the peripheral upper surface $201_1$ of the ESC 201, or in other words, the ring support surface. The ESC 201 includes an electrode 109 in the center portion to electrostatically clamp the wafer W and an electrode 204 in the periphery to electrostatically clamp the edge ring E.

The electrode 204 receives a DC voltage from a DC power supply (not shown). This generates an electrostatic force for electrostatically clamping the edge ring E onto the peripheral upper surface $201_1$ of the ESC 201 (hereafter, a ring support surface). The electrode 204 is, for example, bipolar including a pair of electrodes, but may also be monopolar.

Each lifter 203 is, for example, a cylindrical lifter that ascends and descends relative to the ring support surface $201_1$ of the ESC 201. When the lifter 203 ascends, its upper end protrudes from the ring support surface $201_1$ to support the edge ring E. The lifters 203 allow transfer of the edge ring E between the ESC 201 and the transfer arm 71 in the transferrer 70. Three or more lifters 203 are spaced from one another in the circumferential direction of the ESC 201. Each lifter 203 extends in the vertical direction.

Each lifter 203 is connected to a drive 205 that raises and lowers the lifter 203. The drive 205 is, for example, provided for each lifter 203. The drive 205 includes, for example, a motor (not shown) as a drive source that generates a driving force to raise and lower the lifter 203.

Each lifter 203 is placed through a through-hole 206 having the upper end that is open in the ring support surface 201₁ of the ESC 201. The through-hole 206 extends through, for example, the periphery of the ESC 201, the lower electrode 200, and the insulator 202.

As shown in FIG. 13, supply ports 207 for the heat transfer medium are located in the ring support surface 201₁ of the ESC 201 in the wafer support 101A. For example, multiple supply ports 207 are located in the ring support surface 201₁. The ring support surface 201₁ may have grooves 208. The grooves 208 allow the heat transfer medium to flow and spread along the ring support surface 201₁.

A channel 209 is located in the wafer support 101A. The channel 209 has its ends connected to the respective supply ports 207 to allow fluid passage. The channel 209 has another end, opposite to these ends, that is fluidly connected to, for example, a gas supply unit 210. The channel 209 has, for example, thinner ends adjacent to the ring support surface 201₁ (more specifically, for example, a portion inside the ESC 201). The heat transfer medium in the channel 209 is supplied to the ring support surface 201₁ by capillary action through the supply ports 207. The channel 209 extends through, for example, the ESC 201, the lower electrode 200, and the insulator 202.

The gas supply unit 210 may include one or more gas sources 211 and one or more flow controllers 212. In one exemplary embodiment, the gas supply unit 210 supplies, for example, one or more heat transfer medium generation gases from the respective gas sources 211 to the wafer support 101A through the corresponding flow controllers 212. Each flow controller 212 may include, for example, a mass flow controller or a pressure-based flow controller. The gas supply unit 210 may further include one or more flow rate modulators that supply one or more heat transfer medium generation gases at a modulated flow rate or in a pulsed manner.

The heat transfer medium generation gas supplied from the gas supply unit 210 is cooled in the channel 209 by, for example, the lower electrode 200 cooled by a temperature adjusting fluid in the channel 108, liquefies or solidifies, and then turns into a heat transfer medium including at least one of a liquid medium or a solid medium with fluidity. As described above, the heat transfer medium is supplied to the ring support surface 201₁ by, for example, capillary action, through the supply ports 207 to form the heat transfer layer DA. The channel 108 may thus serve as at least a part of a cooler to cool and convert the heat transfer medium generation gas in the channel 209 to a heat transfer medium, and the gas supply unit 210 may serve as at least a part of a heat transfer layer formation unit to form the heat transfer layer DA on the ring support surface 201₁.

Wafer Processing in Processing Module 1A

Figure 14:
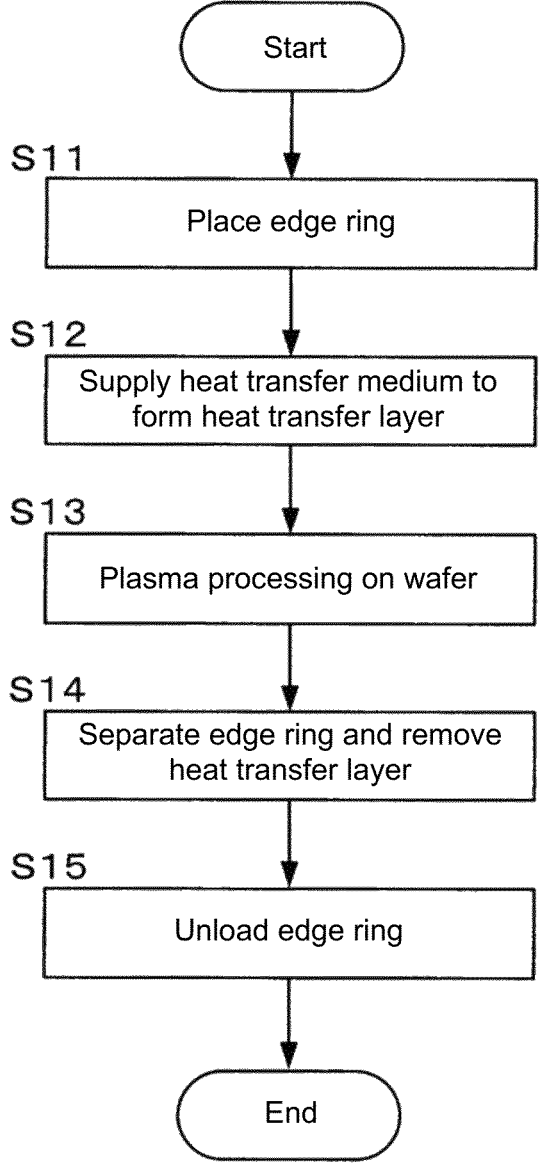
FIG. 14 is a flowchart of example wafer processing performed in the processing module in FIGS. 12 and 13.
Figure 15:
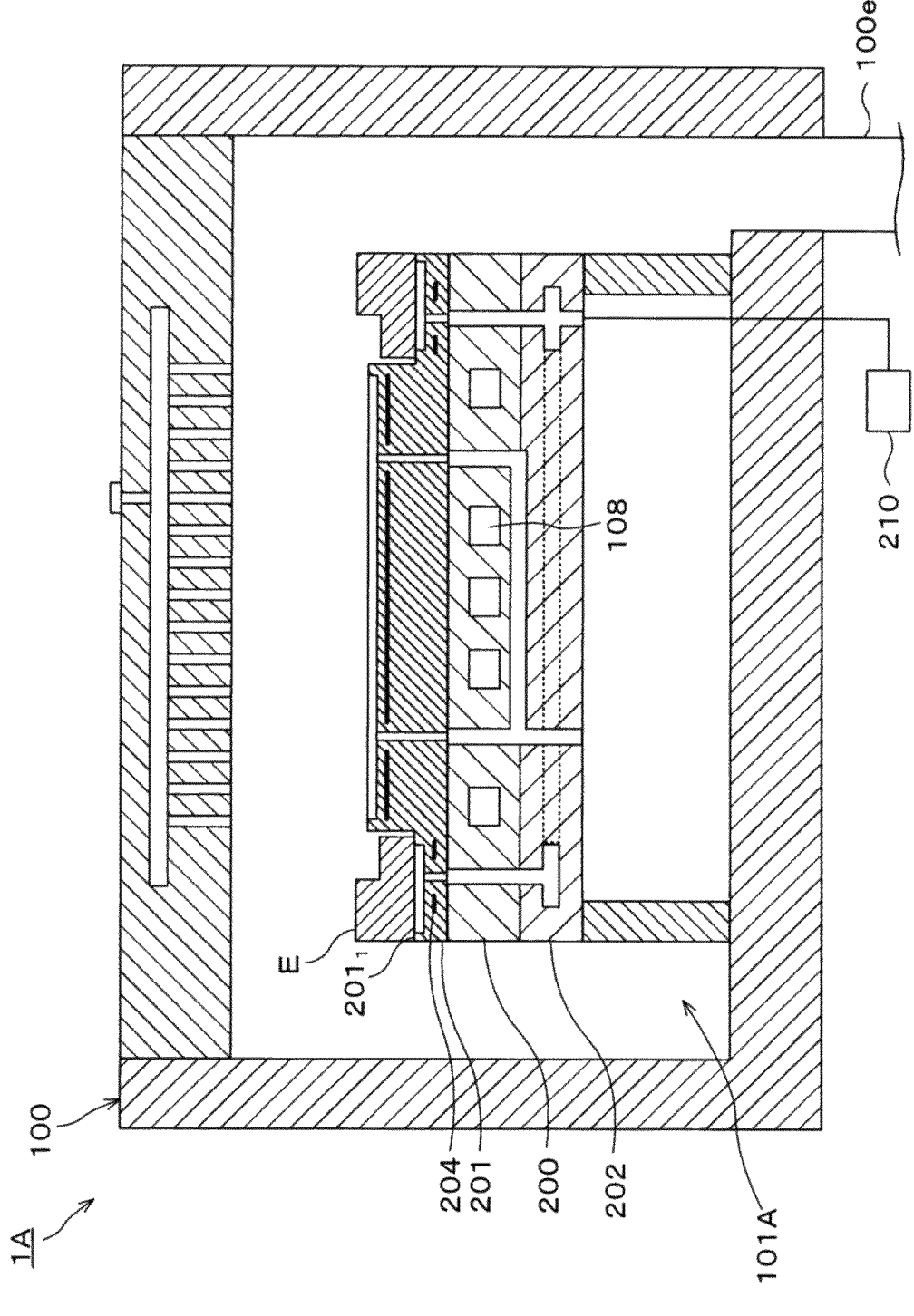
FIG. 15 is a diagram of the processing module in FIGS. 12 and 13 in a processing state during the wafer processing.
Figure 16:
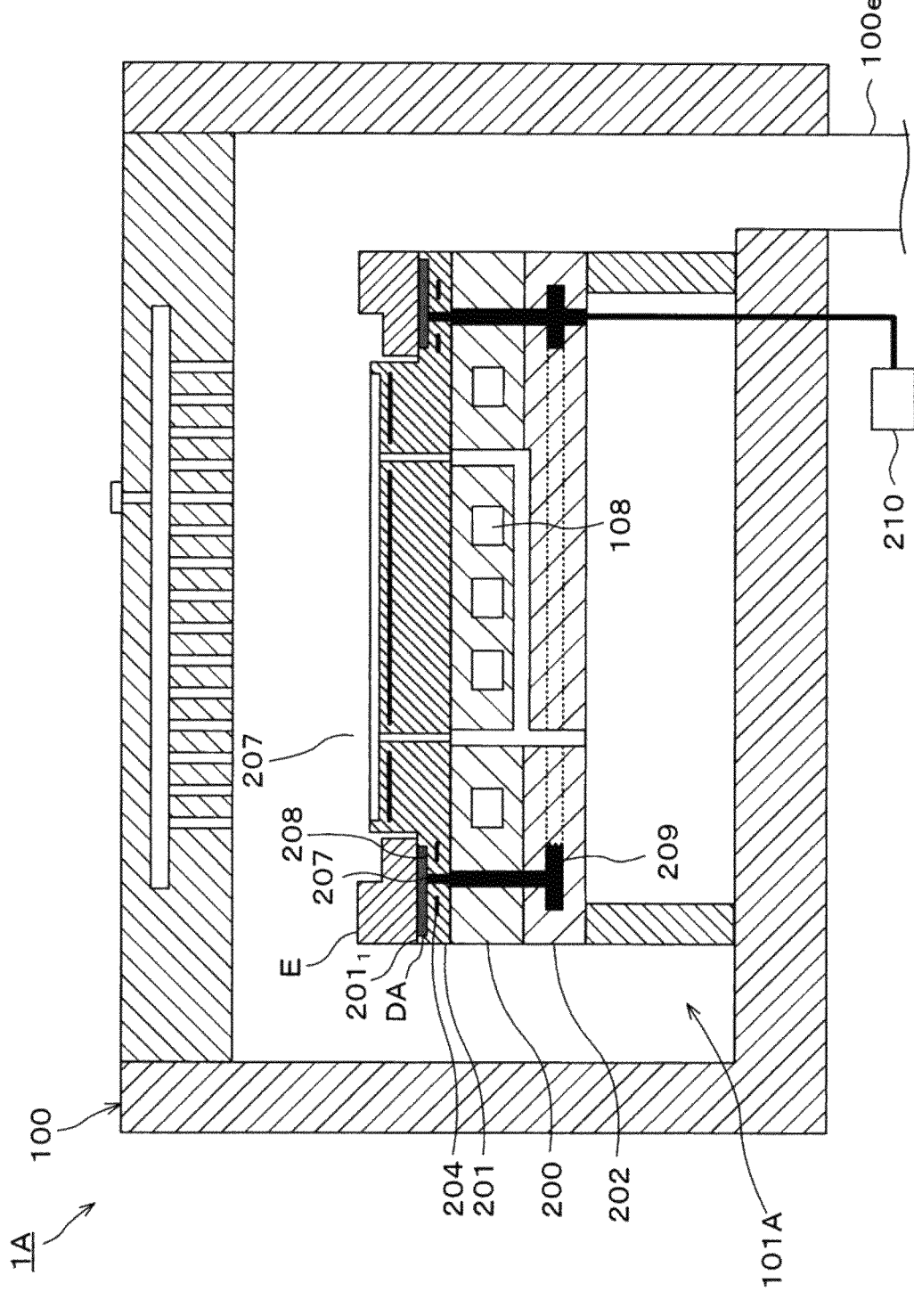
FIG. 16 is a diagram of the processing module in FIGS. 12 and 13 in a processing state during the wafer processing.
Figure 17:
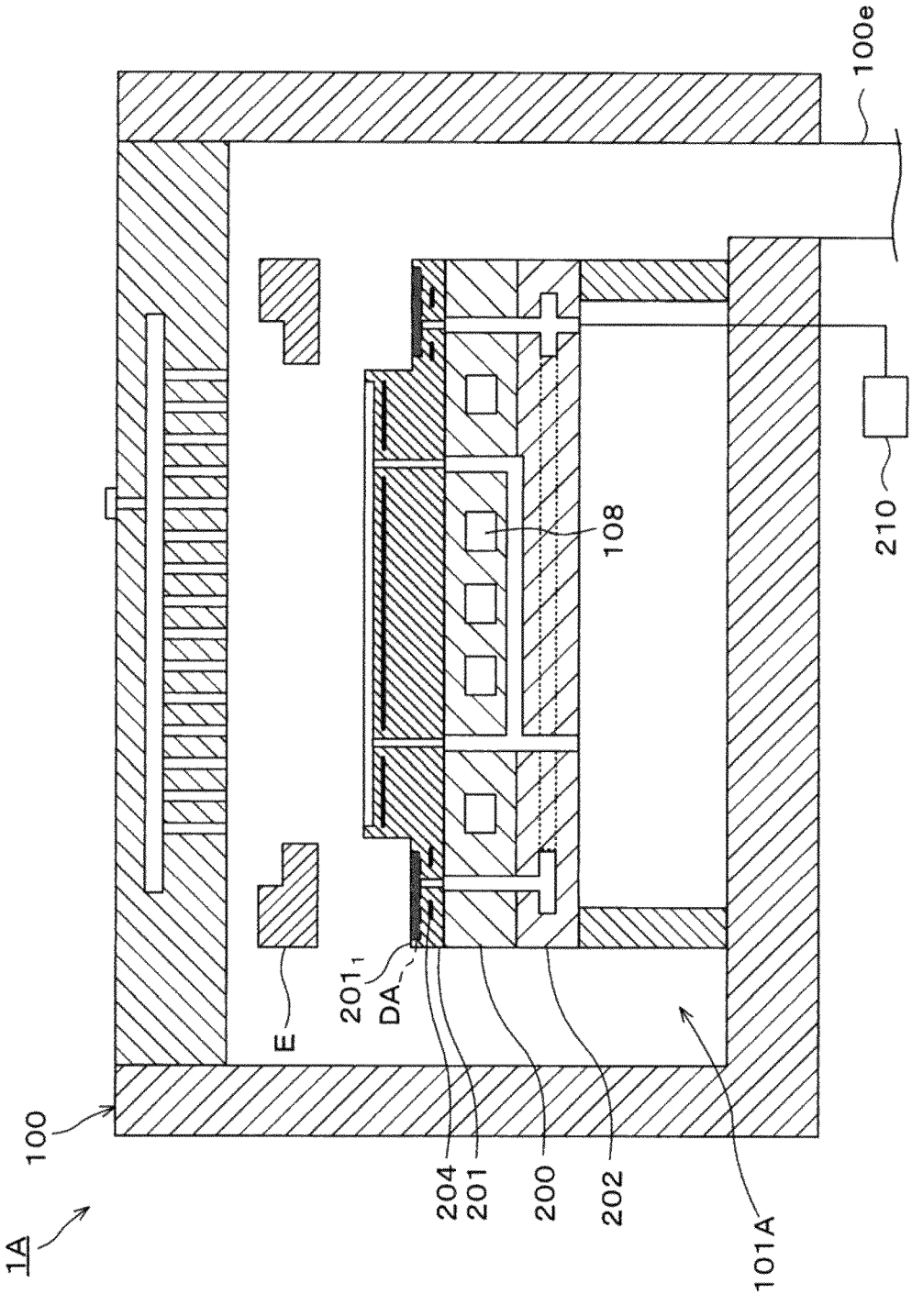
FIG. 17 is a diagram of the processing module in FIGS. 12 and 13 in a processing state during the wafer processing.

Example wafer processing including a process of replacing the edge ring E and performed in the processing module 1A will now be described with reference to FIGS. 14 to 17. FIG. 14 is a flowchart of example wafer processing. FIGS. 15 to 17 are each a diagram of the processing module 1A in a processing state during the wafer processing. The processing described below is performed under the control of the controller 160.

As shown in, for example, FIGS. 14 and 15, an edge ring E is placed onto the ring support surface 201₁ of the wafer support 101A (step S11). More specifically, the edge ring E is loaded into the plasma processing chamber 100 by the transferrer 70, and is placed onto the ring support surface 201₁ of the ESC 201 using the lifters 203 that can ascend or descend. The internal space of the plasma processing chamber 100 is then decompressed to a predetermined degree of vacuum (pressure p11) by the exhaust system 150.

The edge ring E is transferred into the plasma processing chamber 100 in, for example, the manner described below. First, an edge ring E in the storage module 60 is held by the transfer arm 71 in the transferrer 70. The transfer arm 71 holding the edge ring E is then placed into the plasma processing chamber 100 in the processing module 1A through a port (not shown). The edge ring E is then transferred by the transfer arm 71 to above the ring support surface 201₁ of the ESC 201. The edge ring E is placed onto the ring support surface 201₁ of the ESC 201 with the lifters 203 that can ascend and descend and the transfer arm 71 pulled out of the plasma processing chamber 100.

As shown in FIG. 16, the heat transfer medium including at least one of a liquid medium or a solid medium with fluidity is then supplied to between the ring support surface 201₁ and the back surface of the edge ring E through the wafer support 101A to form the heat transfer layer DA (step S12).

More specifically, the edge ring E is held on the wafer support 101A. For example, a DC voltage may be applied to the electrode 204 in the ESC 201 to electrostatically clamp the edge ring E with the ESC 201 with an electrostatic force. In this case, the temperature of the ring support surface 201₁ is adjusted to a temperature T11, and the temperature in the channel 209 is adjusted to the temperature T11 accordingly. The temperature T11 is set to a temperature at which the processing can be performed effectively. The temperature T11 may be, for example, equal to the temperature of the ring support surface 201₁ during the processing.

After the edge ring E is held on the wafer support 101A, the heat transfer medium generation gas is supplied from the gas supply unit 210 to the channel 209 in the wafer support 101A at a temperature T12 (>T11) and a pressure p12 (>p11). The heat transfer medium generation gas supplied to the channel 209 is cooled to the temperature T11 in the channel 209, and turns into a heat transfer medium including at least one of a liquid medium or a solid medium with fluidity. The heat transfer medium is then supplied to the ring support surface 201₁ by, for example, capillary action, through the supply ports 207. The heat transfer medium supplied to the ring support surface 201₁ spreads along the ring support surface 201₁ by capillary action, which results from a clearance between the ring support surface 201₁ and the back surface of the edge ring E. This forms the heat transfer layer DA. The heat transfer layer DA is deformable, similarly to the heat transfer layer D described above.

As described above, the grooves 208 on the ring support surface 201₁ widen the clearance between the ring support surface 201₁ and the back surface of the edge ring E. This allows the heat transfer medium to spread appropriately along the ring support surface 201₁ by capillary action. A pressure p13 applied to the heat transfer layer DA is 0.1 to 100 Torr, including the pressure applied to the heat transfer layer DA by electrostatically clamping the edge ring E.

The supply of the heat transfer medium to the ring support surface $201_1$ (more specifically, the supply of the heat transfer medium generation gas from the gas supply unit 210) is stopped when, for example, the supply amount reaches a predetermined amount (more specifically, when the supply time of the heat transfer medium generation gas from the gas supply unit 210 exceeds a predetermined time). For example, a monitor such as a camera may be used to monitor leakage of the heat transfer medium from between the ring support surface $201_1$ and the back surface of the edge ring E. When leakage is detected, the supply of the heat transfer medium to the ring support surface $201_1$ may be stopped.

Plasma processing is then performed on the wafer W on the upper surface, or the support surface, of the ESC 201 on which the heat transfer layer DA is formed (step S13). More specifically, for example, plasma processing is performed in the same manner as the processing described with reference to FIG. 3 and other figures. More specifically, for example, after the wafer W is placed on the wafer support surface $104_1$ of the wafer support 101A and the heat transfer layer D is formed between the wafer support surface $104_1$ and the back surface of the wafer W, plasma processing is performed on the wafer W. The heat transfer layer D is then vaporized and removed, and the wafer W is unloaded.

During plasma processing, the ring support surface $201_1$ is adjusted to the predetermined temperature T11 with the temperature adjusting fluid flowing through the channel 108 to adjust the temperature of the edge ring E. During plasma processing, the edge ring E is placed on the ring support surface $201_1$ with the heat transfer layer DA in between. The heat transfer layer DA is deformable as described above, allowing the lower surface, or the back surface, of the edge ring E to be in close contact with the heat transfer layer DA. The heat transfer layer DA is formed from the heat transfer medium including at least one of a liquid medium or a solid medium with fluidity. The heat transfer layer DA thus has higher thermal conductivity than a heat transfer gas, such as He. With the heat transfer layer DA, the temperature of the edge ring E can be adjusted more efficiently through the ring support surface $201_1$ than when a heat transfer gas, such as He, is supplied to between the ring support surface $201_1$ and the back surface of the edge ring E. More specifically, when a large amount of heat is input from the plasma P to the edge ring E during plasma processing, the edge ring E can be maintained at a constant temperature by adjusting the temperature of the ring support surface $201_1$. When the set temperature of the edge ring E is changed during plasma processing, the temperature of the edge ring E can be immediately adjusted to the changed set temperature by adjusting the temperature of the ring support surface $201_1$.

During plasma processing, a DC voltage is still applied to the electrode 204 in the ESC 201 to electrostatically clamp the edge ring E with the ESC 201. The degree of contact of the edge ring E with the wafer support 101A may be controlled using an electrostatic force to control heat removal from the edge ring E through the wafer support 101A.

After plasma processing on the wafer W, the edge ring E is separated from the ring support surface $201_1$, and the heat transfer layer DA is vaporized and removed (step S14). In one example, the heat transfer layer DA is removed through vaporization. The separation of the edge ring E from the ring support surface $201_1$, or the removal of the edge ring E, may not be performed every time when plasma processing is performed on the wafer W, but may be performed when the edge ring E is worn or when the heat transfer layer DA is damaged or worn by plasma.

In step S14, more specifically, after the holding of the edge ring E on the wafer support 101A is stopped, or in other words, after the electrostatic clamping of the edge ring E with the ESC 201 is stopped, the edge ring E is raised by the lifters 203 to be separate from the ring support surface $201_1$, as shown in FIG. 16. Once the edge ring E is separated, the heat transfer layer DA is exposed to a decompressed atmosphere, or more specifically, to an atmosphere with the pressure p11 of less than 0.001 Torr, thus being vaporized and removed. At least one of exposure of the heat transfer layer DA to plasma, heating of the heat transfer layer DA, or light irradiation onto the heat transfer layer DA may be used to remove the heat transfer layer DA from the ring support surface $201_1$, in place of or in addition to exposure of the heat transfer layer DA to a decompressed atmosphere.

The heat transfer medium generation gas for the heat transfer layer DA may be the same as or different from that for the heat transfer layer D.

The edge ring E is then unloaded (step S15). More specifically, the edge ring E is transferred from the lifters 203 to the transferrer 70, and is unloaded from the plasma processing chamber 100 by the transferrer 70. This completes the wafer processing.

Exemplary Advantageous Effects and Others

In the present exemplary embodiment, as described above, the heat transfer medium including at least one of a liquid medium or a solid medium with fluidity is supplied to between the ring support surface $201_1$ and the back surface of the edge ring E through the wafer support 101A to form the heat transfer layer DA. In the present exemplary embodiment, the temperature of the edge ring E is efficiently adjustable through the ring support surface $201_1$ during plasma processing, as in the first exemplary embodiment. The above heat transfer medium is less likely to clog the channel 209. No step for removing the heat transfer layer DA is used separately, improving throughput.

In the present exemplary embodiment, the edge ring E is electrostatically clamped onto the ring support surface $201_1$ with an electrostatic force from the ESC 201 during plasma processing. This allows the heat transfer layer DA and the lower surface of the edge ring E to be in closer contact with each other, further improving the efficiency of heat removal from the edge ring E or the efficiency of heating the edge ring E through the ring support surface $201_1$ and the heat transfer layer DA.

Modifications of Forming Heat Transfer Layer DA for Edge Ring, Example of Electrical Characteristics of Heat Transfer Layer DA, and Specific Example of Grooves 208

In the processing module 1 in FIGS. 1 and 2, the wafer W undergoes temperature adjustment through the wafer support 101 and the heat transfer layer D formed from the heat transfer medium. In the processing module 1A in FIGS. 12 and 13, both the wafer W and the edge ring E undergo the above temperature adjustment. However, the temperature may be adjusted only for the edge ring E. More specifically, the processing module 1A in the examples in FIGS. 12 and 13 includes both the channel 209 for forming the heat transfer layer DA for the edge ring E and the channel 115 for forming the heat transfer layer D for the wafer W. In some exemplary embodiments, the channel 115 may be eliminated.

In the example described above, both the wafer W and the edge ring E undergo the above temperature adjustment, and the heat transfer layer D for the wafer W is formed at a time different from the time at which the heat transfer layer DA for the edge ring E is formed. However, the heat transfer layer D and the heat transfer layer DA may be formed at the same time. This improves throughput.

The heat transfer medium to form the heat transfer layer DA for the edge ring E may be supplied in any manner other than in the above example. Modifications similar to those in supplying the heat transfer medium to form the heat transfer layer D for the wafer W described above may be applied.

The heat transfer medium to form the heat transfer layer DA for the edge ring E may be any medium other than in the above example. Modifications similar to those in the heat transfer medium to form the heat transfer layer D for the wafer W described above may be applied.

A specific example similar to the grooves 114 for forming the heat transfer layer DA for the edge ring E described above may be used for the grooves 208 for forming the heat transfer layer DA for the edge ring E.

Similarly to the wafer support surface, the ring support surface may have portions formed from a porous material located other than the grooves 208 (more specifically, for example, the top of the support posts in the grooves 208). When the grooves 208 are not located on the ring support surface, the ring support surface may be entirely formed from the porous material.

The heat transfer layer DA for the edge ring E may be, similarly to the heat transfer layer D for the wafer W, formed on the entire ring support surface $201_1$, or on a part of the ring support surface $201_1$. For example, the heat transfer layer DA may be formed adjacent to the inner periphery of the ring support surface $201_1$, or may be formed adjacent to the outer periphery of the ring support surface $201_1$.

The heat transfer layer DA for edge ring E may have, similarly to the heat transfer layer D for the wafer W, different thicknesses in the plane of the ring support surface $201_1$. For example, the heat transfer layer DA may be thinner adjacent to the inner periphery than adjacent to the outer periphery of the ring support surface $201_1$, or may be thinner adjacent to the outer periphery than adjacent to the inner periphery of the ring support surface $201_1$.

When the grooves 208 are not located on the ring support surface $201_1$ and the surface is entirely formed from the porous material, the porous material may have different thicknesses in different areas on the ring support surface $201_1$.

The heat transfer layer DA for the edge ring E may be formed from a conductive medium with high thermal conductivity and a conductive medium with low thermal conductivity mixed together. In this case, the mixing ratio of these conductive media may be different in different areas on the ring support surface $201_1$.

The density of the grooves 208 may be different in different areas on the ring support surface $201_1$.

The heat transfer layer DA for the edge ring E may be electrically insulating. The heat transfer layer DA may be conductive. The heat transfer layer DA may include a conductive portion surrounded by an electrically insulating portion.

As described above, the heat transfer layer DA may be formed on the entire ring support surface $201_1$, or on a part of the ring support surface $201_1$. A heat transfer gas, such as a He gas, may be supplied to an area of the ring support surface $201_1$ without the heat transfer layer DA.

In the above example, an ESC 201 is used as a fastener that holds or fastens the edge ring E on the ring support surface $201_1$. The ESC 201 electrostatically clamps the edge ring E with an electrostatic force generated by a DC voltage applied to the internal electrode 204. The electrical fastener may not use an electrostatic force. In some exemplary embodiments, the fastener may hold the edge ring E with a Johnsen-Rahbek force. The above fastener may hold the wafer W in any manner other than the electrical manner described above. For example, the above fastener may be a fastener, such as a clamp, to physically hold the wafer W. The above fastener may be eliminated.

In the above example, the edge ring E is stored in the storage module 60 connected to the transfer module 50. In some exemplary embodiments, the edge ring E may be stored in the FOUP located on the load port 32, similarly to the wafer W.

Other Modifications

In the above example, plasma etching is performed as the plasma processing. However, the technique according to one or more exemplary embodiments of the present disclosure may be applied to processing other than etching (e.g., film deposition) as the plasma processing.

A cover ring may be located on the wafer support in the processing module used for performing plasma processing. The cover ring covers the outer surface of the edge ring. In this case, a heat transfer medium may be supplied to between the support surface on which the cover ring is placed and the bottom surface of the cover ring on the wafer support to form a heat transfer layer, in the same manner as the heat transfer layer DA for the edge ring E described above.

The exemplary embodiments disclosed herein are illustrative in all aspects and should not be construed to be restrictive. The components in the above exemplary embodiments may be eliminated, substituted, or modified in various forms without departing from the spirit and scope of the appended claims. For example, the components in the above exemplary embodiments may be combined as appropriate. These combinations produce the same advantageous effects as the respective exemplary embodiments in the combinations, as well as other advantageous effects that are apparent to those skilled in the art from the exemplary embodiments described herein.

The effects described herein are merely illustrative or exemplary and are not limitative. In other words, the technique according to one or more exemplary embodiments of the present disclosure may produce other effects that will be apparent to those skilled in the art from the exemplary embodiments described herein, in addition to or in place of the above effects.

The example structures described below may also fall within the technical scope of the present disclosure.

(1) A processing method for performing plasma processing on a substrate, the method comprising:

placing a temperature adjustment target onto a support surface of a substrate support in a decompressible processing;

forming a heat transfer layer by supplying, through the substrate support, a heat transfer medium including at least one of a liquid medium or a solid medium with fluidity to between the support surface of the substrate support and a back surface of the temperature adjustment target;

performing plasma processing on the substrate on the support surface on which the heat transfer layer is formed; and separating the temperature adjustment target from the support surface after the plasma processing.

(2) The processing method according to (1), wherein the forming the heat transfer layer includes supplying a heat transfer medium generation gas into the substrate support and cooling the heat transfer medium generation gas in the substrate support to convert the heat transfer medium generation gas to the heat transfer medium.

(3) The processing method according to (1) or (2), wherein the forming the heat transfer layer includes supplying the heat transfer medium from outside the substrate support into the substrate support.

(4) The processing method according to (2) or (3), wherein the forming the heat transfer layer includes supplying the heat transfer medium in the substrate support to the support surface by capillary action.

(5) The processing method according to any one of (1) to (4), wherein the forming the heat transfer layer includes spreading the heat transfer medium supplied to between the support surface and the back surface of the temperature adjustment target along the support surface by capillary action.

(6) The processing method according to (5), wherein the spreading the heat transfer medium includes spreading the heat transfer medium by capillary action through a groove on the support surface.

(7) The processing method according to any one of (1) to (6), wherein the forming the heat transfer layer includes forming the heat transfer layer in an area of the temperature adjustment target.

(8) The processing method according to any one of (1) to (7), wherein the forming the heat transfer layer includes forming the heat transfer layer having different thicknesses in different areas of the temperature adjustment target.

(9) The processing method according to any one of (1) to (8), wherein the forming the heat transfer layer includes forming the heat transfer layer to allow a ratio of a portion of the support surface on which the heat transfer layer is formed to other portions to vary in different areas of the temperature adjustment target.

(10) The processing method according to any one of (1) to (9), wherein the forming the heat transfer layer includes fastening the temperature adjustment target to the support surface.

(11) The processing method according to (10), wherein the temperature adjustment target is fastened to the support surface by electrostatically clamping the temperature adjustment target with an electrostatic force from an electrostatic chuck.

(12) The processing method according to any one of (1) to (11), wherein the temperature adjustment target is at least one of the substrate or an edge ring surrounding the substrate on the support surface.

(13) The processing method according to (12), wherein the temperature adjustment target includes the substrate and the edge ring, and the forming the heat transfer layer for the substrate is performed at a time different from a time at which the forming the heat transfer layer for the edge ring is performed.

(14) The processing method according to (12), wherein the temperature adjustment target includes the substrate and the edge ring, and the forming the heat transfer layer for the substrate is performed at a same time as the forming the heat transfer layer for the edge ring.

(15) The processing method according to any one of (1) to (14), wherein the heat transfer layer is removed when the temperature adjustment target is separated from the support surface.

(16) A plasma processing apparatus, comprising:

a processing chamber being decompressible;

a substrate support located in the processing chamber and including a support surface on which a substrate is placeable; and a controller, wherein the substrate support includes a channel to supply a heat transfer medium including at least one of a liquid medium or a solid medium with fluidity to between the support surface and a back surface of the substrate, and the controller performs control to cause operations including placing a temperature adjustment target onto the support surface, forming a heat transfer layer by supplying, through the substrate support, the heat transfer medium to between the support surface and a back surface of the temperature adjustment target, performing plasma processing on the substrate on the support surface on which the heat transfer layer is formed, and separating the temperature adjustment target from the support surface after the plasma processing.

(17) The plasma processing apparatus according to (16), further comprising:

a gas supply configured to supply a heat transfer medium generation gas to the channel in the substrate support; and a cooler configured to cool the heat transfer medium generation gas in the channel to convert the heat transfer medium generation gas to the heat transfer medium.

(18) The plasma processing apparatus according to (16) or (17), further comprising:

a medium supply configured to supply the heat transfer medium to the channel in the substrate support.

(19) The plasma processing apparatus according to any one of (16) to (18), wherein the channel allows the heat transfer medium to be supplied to the support surface by capillary action.

(20) The plasma processing apparatus according to any one of (16) to (19), wherein the support surface has a groove, and the groove allows the heat transfer medium to spread along the support surface by capillary action through the groove.

(21) The plasma processing apparatus according to (20), wherein the groove is located in an area of the support surface.

(22) The plasma processing apparatus according to (20) or (21), wherein the groove has different depths in different areas of the support surface.

(23) The plasma processing apparatus according to any one of (20) to (22), wherein the support surface has different groove densities in different areas of the support surface.

(24) The plasma processing apparatus according to any one of (20) to (23), wherein the groove receives a porous material.

(25) The plasma processing apparatus according to any one of (16) to (24), further comprising:

a fastener configured to fasten the substrate to the support surface.

(26) The plasma processing apparatus according to (25), wherein the fastener is an electrostatic chuck configured to fasten the temperature adjustment target to the support surface by electrostatically clamping the temperature adjustment target with an electrostatic force.

(27) The plasma processing apparatus according to any one of (16) to (25), wherein the temperature adjustment target is at least one of the substrate or an edge ring surrounding the substrate on the support surface.

(28) The plasma processing apparatus according to (27), wherein the temperature adjustment target includes the substrate and the edge ring, and the forming the heat transfer layer for the substrate is performed at a time different from a time at which the forming the heat transfer layer for the edge ring is performed.

(29) The plasma processing apparatus according to (27), wherein the temperature adjustment target includes the substrate and the edge ring, and the forming the heat transfer layer for the substrate is performed at a same time as the forming the heat transfer layer for the edge ring.

(30) The plasma processing apparatus according to any one of (16) to (29), wherein the heat transfer layer is removed when the temperature adjustment target is separated from the support surface.

REFERENCE SIGNS LIST 1, 1A Processing module
100 Plasma processing chamber
101, 101A Wafer support
$104_1$ Wafer support surface
108 Channel
115, 209 Channel
160 Controller
$201_1$ Ring support surface
D, DA Heat transfer layer
E Edge ring
W Wafer

The invention claimed is:

1. A processing method for performing plasma processing on a substrate, the method comprising:

placing a temperature adjustment target onto a support surface of a substrate support in a decompressible processing chamber;

forming a heat transfer layer by supplying, through the substrate support, a heat transfer medium including at least one of a liquid medium or a solid medium with fluidity to between the support surface of the substrate support and a back surface of the temperature adjustment target;

performing plasma processing on the substrate on the support surface on which the heat transfer layer is formed; and separating the temperature adjustment target from the support surface after the plasma processing.

2. The processing method according to claim 1, wherein the forming the heat transfer layer includes supplying a heat transfer medium generation gas into the substrate support and cooling the heat transfer medium generation gas in the substrate support to convert the heat transfer medium generation gas to the heat transfer medium.

3. The processing method according to claim 1, wherein the forming the heat transfer layer includes supplying the heat transfer medium from outside the substrate support into the substrate support.

4. The processing method according to claim 2, wherein the forming the heat transfer layer includes supplying the heat transfer medium in the substrate support to the support surface by capillary action.

5. The processing method according to claim 1, wherein the forming the heat transfer layer includes spreading the heat transfer medium supplied to between the support surface and the back surface of the temperature adjustment target along the support surface by capillary action.

6. The processing method according to claim 5, wherein the spreading the heat transfer medium includes spreading the heat transfer medium by capillary action through a groove on the support surface.

7. The processing method according to claim 1, wherein the forming the heat transfer layer includes forming the heat transfer layer in an area of the temperature adjustment target.

8. The processing method according to claim 1, wherein the forming the heat transfer layer includes forming the heat transfer layer having different thicknesses in different areas of the temperature adjustment target.

9. The processing method according to claim 1, wherein the forming the heat transfer layer includes forming the heat transfer layer to allow a ratio of a portion of the support surface on which the heat transfer layer is formed to other portions to vary in different areas of the temperature adjustment target.

10. The processing method according to claim 1, wherein the forming the heat transfer layer includes fastening the temperature adjustment target to the support surface.

11. The processing method according to claim 10, wherein the temperature adjustment target is fastened to the support surface by electrostatically clamping the temperature adjustment target with an electrostatic force from an electrostatic chuck.

12. The processing method according to claim 1, wherein the temperature adjustment target is at least one of the substrate or an edge ring surrounding the substrate on the support surface.

13. The processing method according to claim 12, wherein the temperature adjustment target includes the substrate and the edge ring, and the forming the heat transfer layer for the substrate is performed at a time different from a time at which the forming the heat transfer layer for the edge ring is performed.

14. The processing method according to claim 12, wherein the temperature adjustment target includes the substrate and the edge ring, and the forming the heat transfer layer for the substrate is performed at a same time as the forming the heat transfer layer for the edge ring.

15. A plasma processing apparatus, comprising:

a processing chamber that is decompressible;

a substrate support located in the processing chamber and including a support surface on which a substrate is placeable; and a controller, wherein the substrate support includes a channel to supply a heat transfer medium including at least one of a liquid medium or a solid medium with fluidity to between the support surface and a back surface of the substrate, and the controller performs control to cause operations including placing a temperature adjustment target onto the support surface, forming a heat transfer layer by supplying, through the substrate support, the heat transfer medium to between the support surface and a back surface of the temperature adjustment target, performing plasma processing on the substrate on the support surface on which the heat transfer layer is formed, and separating the temperature adjustment target from the support surface after the plasma processing.

16. The plasma processing apparatus according to claim 15, further comprising:

a gas supply configured to supply a heat transfer medium generation gas to the channel in the substrate support; and a cooler configured to cool the heat transfer medium generation gas in the channel to convert the heat transfer medium generation gas to the heat transfer medium.

17. The plasma processing apparatus according to claim 15, further comprising:

a medium supply configured to supply the heat transfer medium to the channel in the substrate support.

18. The plasma processing apparatus according to claim 15, wherein the channel allows the heat transfer medium to be supplied to the support surface by capillary action.

19. The plasma processing apparatus according to claim 15, wherein the support surface has a groove, and the groove allows the heat transfer medium to spread along the support surface by capillary action through the groove.

20. The plasma processing apparatus according to claim 19, wherein the groove is located in an area of the support surface.

21. The plasma processing apparatus according to claim 19, wherein the groove has different depths in different areas of the support surface.

22. The plasma processing apparatus according to claim 19, wherein the support surface has different groove densities in different areas of the support surface.

23. The plasma processing apparatus according to claim 19, wherein the groove receives a porous material.

24. The plasma processing apparatus according to claim 15, further comprising:

a fastener configured to fasten the substrate to the support surface.

25. The plasma processing apparatus according to claim 24, wherein the fastener is an electrostatic chuck configured to fasten the temperature adjustment target to the support surface by electrostatically clamping the temperature adjustment target with an electrostatic force.

26. The plasma processing apparatus according to claim 15, wherein the temperature adjustment target is at least one of the substrate or an edge ring surrounding the substrate on the support surface.

27. The plasma processing apparatus according to claim 26, wherein the temperature adjustment target includes the substrate and the edge ring, and the forming the heat transfer layer for the substrate is performed at a time different from a time at which the forming the heat transfer layer for the edge ring is performed.

28. The plasma processing apparatus according to claim 26, wherein the temperature adjustment target includes the substrate and the edge ring, and the forming the heat transfer layer for the substrate is performed at a same time as the forming the heat transfer layer for the edge ring.

* * * * *